US009655267B2

(12) United States Patent
Cope et al.

(10) Patent No.: US 9,655,267 B2
(45) Date of Patent: May 16, 2017

(54) RETRACTABLE DISPLAY SYSTEM AND METHOD OF USE

(71) Applicant: NANOLUMENS ACQUISITION, INC., Norcross, GA (US)

(72) Inventors: Richard Craig Cope, Duluth, GA (US); Douglas Andrew Price, Lawrenceville, GA (US); Drew Fredrick Meincke, Woodstock, GA (US)

(73) Assignee: NanoLumens Acquisition, Inc., Norcross, GA (US)

( * ) Notice: Subject to any disclaimer, the term of this patent is extended or adjusted under 35 U.S.C. 154(b) by 514 days.

(21) Appl. No.: 13/915,485

(22) Filed: Jun. 11, 2013

(65) Prior Publication Data
US 2013/0271940 A1 Oct. 17, 2013

Related U.S. Application Data

(63) Continuation-in-part of application No. 13/494,012, filed on Jun. 11, 2012, now Pat. No. 9,071,809, which
(Continued)

(51) Int. Cl.
*H05K 7/14* (2006.01)
*G09F 9/33* (2006.01)
(Continued)

(52) U.S. Cl.
CPC ............. *H05K 7/14* (2013.01); *G09F 9/33* (2013.01); *G09F 21/04* (2013.01); *H04N 5/775* (2013.01); *H04N 21/41415* (2013.01)

(58) Field of Classification Search
CPC .......... H05K 7/14; H05K 5/00; H05K 5/0021; H04N 5/775; H04N 21/41415;
(Continued)

(56) References Cited

U.S. PATENT DOCUMENTS 5,201,898 A * 4/1993 Pierce ................. B60G 7/02
280/124.116
5,805,117 A * 9/1998 Mazurek ............. G02F 1/13336
248/919
(Continued)

FOREIGN PATENT DOCUMENTS

WO 02/43386 5/2002
WO 2009/105539 8/2009

OTHER PUBLICATIONS

International Search Authority, "International Search Report," PCT/US09/30040, mailed Mar. 10, 2009.
(Continued)

*Primary Examiner* — Jerry Wu
*Assistant Examiner* — Stephen Sul
(74) *Attorney, Agent, or Firm* — Theodore Heske, III

(57) ABSTRACT

A retractable display configured as a plurality of interlinked display subassemblies or panels, a transport box having a lid configured to enclose the display system, the box or subassemblies having a rack system configured to support the plurality of linked display subassemblies in the transport box, a lift mechanism configured to assemble and disassemble the plurality of releasably interlinked display subassemblies into a seamless display, and an alignment system configured to align one display subassembly with a neighboring display subassembly and thus, functions as a rugged self-contained transport box of a plurality of interlinked display subassemblies capable of automated assembly into a seamless display larger than its transport box.

21 Claims, 16 Drawing Sheets

Related U.S. Application Data is a continuation-in-part of application No. 13/297,784, filed on Nov. 16, 2011, which is a continuation of application No. 12/348,158, filed on Jan. 2, 2009, now Pat. No. 9,013,367.

(60) Provisional application No. 61/658,890, filed on Jun. 12, 2012, provisional application No. 61/019,144, filed on Jan. 4, 2008.

(51) Int. Cl.
  *G09F 21/04* (2006.01)
  *H04N 5/775* (2006.01)
  *H04N 21/414* (2011.01)

(58) Field of Classification Search
  CPC .......... G09F 21/04; G09F 9/33; G06F 1/1616; G06F 1/1656; G06F 1/1632; G06F 1/1626; G06F 1/16; G06F 1/18; G06F 1/181; G06F 1/1615; G06F 1/1601; G06F 2200/1631; G06F 1/1637; G06F 11/3044; A47B 81/061; A47B 21/0073; Y02E 60/12
  USPC .......... 312/310; 361/679.04, 679.01, 679.02, 361/679.05, 725, 724, 729, 730
  See application file for complete search history.

(56) References Cited

U.S. PATENT DOCUMENTS

| | | | |
|---|---|---|---|
| 5,821,688 A | 10/1998 | Shanks et al. | |
| 6,396,985 B2* | 5/2002 | Lowry | G02B 6/06 345/32 |
| 2003/0217495 A1* | 11/2003 | Nagamine | G09F 9/00 40/605 |
| 2004/0124763 A1 | 7/2004 | Nathan et al. | |
| 2004/0178399 A1* | 9/2004 | Blodgett, Jr. | B60P 3/39 254/424 |
| 2005/0140665 A1 | 6/2005 | Faris | |
| 2006/0158578 A1* | 7/2006 | Tsuo | F16M 11/00 349/58 |
| 2006/0170332 A1 | 8/2006 | Tamaki et al. | |
| 2007/0000849 A1* | 1/2007 | Lutz | G09F 9/3026 211/26 |
| 2007/0001927 A1* | 1/2007 | Ricks | G09F 9/3026 345/1.1 |
| 2007/0002130 A1 | 1/2007 | Hartkop | |
| 2007/0035671 A1 | 2/2007 | Ryu | |
| 2007/0146862 A1 | 6/2007 | Moore et al. | |
| 2007/0258032 A1 | 11/2007 | Kaihoko et al. | |
| 2007/0262916 A1* | 11/2007 | Kee | G02F 1/13336 345/1.3 |
| 2008/0218369 A1 | 9/2008 | Krans et al. | |
| 2008/0263924 A1* | 10/2008 | Nearman | G09F 9/30 40/607.13 |
| 2009/0102763 A1 | 4/2009 | Border et al. | |
| 2009/0219225 A1 | 9/2009 | Cope | |
| 2010/0041439 A1* | 2/2010 | Bullister | G06F 1/1615 455/566 |
| 2010/0283889 A1 | 11/2010 | Johnson | |
| 2012/0153788 A1* | 6/2012 | Rozestraten | A47B 81/061 312/310 |
| 2012/0236509 A1 | 9/2012 | Cope et al. | |
| 2012/0275087 A1* | 11/2012 | Corey | A47B 91/005 361/679.01 |

OTHER PUBLICATIONS

International Search Authority, "Written Opinion," PCT/US09/30040, mailed Mar. 10, 2009.
Non-Final Office Action dated Sep. 21, 2011 for U.S. Appl. No. 12/348,158.
Search Report and Written Opinion for PCT/US2011/061147 mailed on Jul. 3, 2012.
International Search Authority, "International Search Report and Written Opinion," PCT/US2013/062853, mailed Mar. 11, 2014.

* cited by examiner

RETRACTABLE DISPLAY SYSTEM AND METHOD OF USE

PRIORITY CLAIM TO RELATED US APPLICATIONS

To the full extent permitted by law, the present United States Non-Provisional patent application hereby claims priority to and the full benefit of U.S. Provisional Patent Application entitled "Retractable Display System and Method of Use", filed on Jun. 12, 2012, having assigned Ser. No. 61/658,890; U.S. Non-Provisional patent application entitled "System for Facilitating Virtual Presence", filed on Nov. 16, 2011, having assigned Ser. No. 13/297,784; U.S. Non-Provisional patent application entitled "Flexible Display", filed on Jan. 2, 2009, having assigned Ser. No. 12/348,158, which claimed priority from U.S. Provisional Patent Application No. 61/019,144 filed on Jan. 4, 2008; and U.S. Non-Provisional patent application entitled "Mobile, Personsize Display System and Method of Use", filed on Jun. 11, 2012, having assigned Ser. No. 13/494,012, incorporated entirely herein by reference.

TECHNICAL FIELD

The disclosure generally relates to mobile displays and more specifically, it is related to a portable, retractable, and light weight display system.

BACKGROUND

Today, there is a significant increase in the desire of many to have large multimedia visual displays in more and more locations, whether for presentations, tradeshows, marketing and advertising, or conferences (temporary display location(s)). Such large multimedia visual displays significantly increase viewer, customer and visitor interaction, retention and recognition.

However a significant challenge exists when trying to erect a support structure and large display for displaying information, pictures or movies inside large spaces, such as ballrooms, conference rooms, convention show floors and the like. For example, a large screen or display and its support structure will be erected flanked by large piping to hold curtains in place to create an artificial wall or defined space. In one example, a projector is placed in front of or behind a large screen to project an image on the screen. In order to see the image projected on the screen the lights in the room are turned down making it difficult for visitors to navigate low light areas. Moreover, to erect a large screen takes two to three people at least three to five hours or longer to set up the screen, taping of data cables and power cables to the carpet, and positioning of the projector to minimize the heat emanating from the projectors, wherein such heat may be disrupting to the audience. Furthermore, projectors in such systems require a throw distance, the space behind the screen needed to position the projector a distance apart from the screen to enable the projector to fill the screen with an image; thereby, reducing the size and inefficient use of ballrooms, conference rooms, convention show floors and the like. Still further, hardware and labor required to construct the support structure for such screen and projector systems adds to the expense of creating large displays in temporary locations and has limited their widespread use.

Another example of a large display system is one configured as a tiled LCD wall by affixing a plurality of LCDs side-by-side mounted to a support structure or superstructure to create a large display. Multiple cables for both data and power are required to operate the tiled LCD wall. These cables are pulled back to a large integration box which is fed by the media player to create one large display across multiple LCDs tiled together. Likewise, a tiled LCD wall requires extensive hardware to create the structure and three or more well-trained crew at least three to five hours or longer to assemble a three module high by three module wide LCD wall. Furthermore, taping of data cables and power cables to the carpet and tying the same with cable ties to the structure from LCD to the integration box, as well as labor and hardware expense of the support structure adds significantly to the expense of creating large displays using a tiled LCD wall in temporary locations and has limited their widespread use.

CRT or LCD displays have drawbacks, such as they utilize heavy, hard-to-move high resolution CRT or LCD displays with glass fronts or covers. Such displays can cause serious injury when bumped or tipped over resulting in an explosion or shards of glass in the viewing area. Because of this risk the support structure includes large, heavy frames to stabilize such displays causing the display portion to be several feet off of the floor. Moreover, these large scale displays tend to be heavy, expensive to operate, not easily transported and set up, and are power hungry.

Still another example of a large display system is a portable display enclosed in a transport box that is larger than the display. Typically such display systems include a mechanical lift mechanism to lift the display up higher than the storage box. While these boxed display systems works for some places it is difficult if not impossible to have a box big enough to hold a large display of the size desired.

Therefore, it is readily apparent that there is a recognizable unmet need for a retractable display system and method of use that provides a large display disassembled as display subassemblies in a transport box that automatically, by push of a button, erects and assembles through electrical, mechanical or other means the display subassemblies into a large seamless display at least two times higher than any one individual display subassembly.

SUMMARY

Briefly described, in an example embodiment, the present apparatus and method overcomes the above-mentioned disadvantages and meets the recognized need for a retractable display system and method of use, in general, a display configured as a plurality of interlinked display subassemblies or panels, a transport box having a lid configured to enclose the display system, the box or subassemblies having a rack system configured to support the plurality of linked display subassemblies in the transport box, a lift mechanism configured to assemble and disassemble the plurality of releasably interlinked display subassemblies into a seamless display, and an alignment system configured to align one display subassembly with a neighboring display subassembly and thus, functions as a rugged self-contained transport box of a plurality of interlinked display subassemblies capable of automated assembly into a seamless display larger than its transport box.

In use, the retractable display system enables one person to wheel the transport box into a temporary display location, plug the transport box unit into a an electric outlet, push an up button on a controller, to lift, align, and assemble the plurality of linked display subassemblies from the rack system into a large interlinked seamless display and alternatively push a down button on a controller, to separate the large interlinked display into linked display subassemblies and lower the linked display subassemblies into the transport box organized by rack system.

According to its major aspects and broadly stated, the present apparatus meets the recognized need for a retractable display system and method of use comprising a plurality of interlinked display subassemblies, a transport box configured to enclose the display system, said transport box configured with a rack system to support said plurality of interlinked display subassemblies, a lift mechanism configured to lift said interlinked display subassemblies, and an alignment system configured to align one said display subassembly with a neighboring said display subassembly to form a seamless display larger than said transport box.

In a preferred embodiment of the retractable display system, includes a retractable display system including two or more interlinked display panels, the display panels having one or more display sub-assemblies, a transport box configured to enclose the display system, the transport box configured with a moveable support structure configured to support the two or more interlinked display panel, a lift system configured to lift the interlinked display panels, and an alignment system configured to align the two or more interlinked display panels to form a substantially seamless display system, wherein the two or more interlinked display panels is greater in height than the transport box.

In still a further exemplary embodiment of the method of deploying foldable display system, including the steps of providing two or more interlinked display panels, the two or more interlinked display panels including a first interlinked display panel linked to a second interlinked display panel, the display panels having one or more display sub-assemblies, a portable transport box configured to enclose the display system, the portable transport box configured with a moveable support structure configured to support the two or more interlinked display panel, a lift system configured to lift the interlinked display panels, a stop assembly positioned on the moveable support structure, and an alignment system, the alignment system is disposed between the first interlinked display panel and the second interlinked display panel, and configured to align the two or more interlinked display panels to form a substantially seamless display system, wherein the two or more interlinked display panels is greater in height than the transport box, positioning the portable transport box, elevating the moveable support structure from within the portable transport box, lifting the first interlinked display panel from a storage position within the portable transport box to a vertical display position, lifting the second interlinked display panel, interlinked to the first interlinked display panel, from a storage position within the portable transport box to a vertical display position above the stop assembly, lowering the first interlinked display panel and the second interlinked display panel until the second interlinked display panel seats on the stop assembly, and lowering the first interlinked display panel and the second interlinked display panel until the alignment system aligns the first interlinked display panel and the second interlinked display panel to form a substantially seamless display system.

In still a further exemplary embodiment of the method of storing foldable display system, including the steps of providing two or more interlinked display panels, the two or more interlinked display panels including a first interlinked display panel linked to a second interlinked display panel, the display panels having one or more display sub-assemblies, a portable transport box configured to enclose the display system, the portable transport box configured with a moveable support structure configured to support the two or more interlinked display panel, a lift system configured to lift the interlinked display panels, a stop assembly positioned on the moveable support structure, and an alignment system, the alignment system is disposed between the first interlinked display panel and the second interlinked display panel, and configured to align the two or more interlinked display panels to form a substantially seamless display system, wherein the two or more interlinked display panels is greater in height than the transport box, lifting the first interlinked display panel and the second interlinked display panel above the stop assembly and separating the first interlinked display panel from the second interlinked display panel, retracting the stop assembly, lowering the first interlinked display panel and the second interlinked display panel until the second interlinked display panel transitions from a vertical display position to a storage position within the portable transport box, lowering the first interlinked display panel until the first interlinked display panel transitions from a vertical display position to a storage position within the portable transport box, and retracting the moveable support structure into the portable transport box.

Accordingly, a feature of the retractable display system and method of use is its ability to provide a rugged self-contained transport box of a plurality of disassembled, interlinked display subassemblies capable of push button automatic assembly into a seamless display larger than its transport box, and more specifically the assembled display is at least two times (2×) the height or more than the individual display subassemblies and/or its transport box.

Another feature of the retractable display system and method of use is its ability to provide a transportable, large, and seamless display disassembled in a small transport box ready for fully automatic assemble.

Yet another feature of the retractable display system and method of use is its ability to provide a folded plurality of interlinked display subassemblies moveable by push button operation by a single person without the need for heavy moving dollies, skids, lift equipment or other moving and lifting equipment.

Yet another feature of the retractable display system and method of use is its ability to provide a large display system that does not require trained personnel to operate, assemble, or transition from storage container to an erect, fully assembled, and operational display.

Yet another feature of the retractable display system and method of use is its ability to provide a fully enclosed automatically operational large display verses, for example, a tiled LCD wall that requires a support structure, hardware, wiring, and cabling organized and packaged as a kit; however, the components of the kit may become broken or misplaced resulting in an individual part delaying setup.

Yet another feature of the retractable display system and method of use is its ability to provide a fully enclosed automatically operation large display verses, for example, a tiled LCD wall that requires a support structure, hardware, wiring, and cabling organized and packaged as a kit, and requires two to three trained personnel three to five hours to unpack and assemble the tiled LCD wall.

Yet another feature of the retractable display system and method of use is its ability to provide a temporary large display system that builds from the bottom up so that the mass of the disassembled display does not have to be elevated above the viewing area and built down from such position.

Yet another feature of the retractable display system and method of use is its ability to provide quick assembly, disassembly, and transportability of a large display without the need for any special tools, special power requirements, or power alterations to operate the retractable display system.

Yet another feature of the retractable display system and method of use is its ability to provide a large display system automatically assembled from a plurality of interlinked display subassemblies operable to generate images on the large display system.

Yet another feature of retractable display system and method of use is its ability to provide a plurality of interlinked display subassemblies disassembled and stored in a moveable transport box ready for automatic single operator deployment.

Yet another feature of retractable display system and method of use is its ability to provide a large seamless display of interlinked display subassemblies ready for automatic single operator disassembly and organized storage in a transport box with no skill or tools in less than 20 minutes.

Yet another feature of retractable display system and method of use is its ability to provide a large seamless display of interlinked display subassemblies ready for automatic single operator erection to a fully assembled, and operational display with no skill or tools in less than 15 or 20 minutes.

Yet another feature of display system and method of use is its ability to provide a transport box having a lid configured to enclose the display system.

Yet another feature of display system and method of use is its ability to provide a transport box having a one or more wheels or casters to enable a single person to quickly and easily roll or move the display from one location to another.

Yet another feature of retractable display system and method of use is its ability to provide a rack system configured to support the plurality of linked display subassemblies in the transport box.

Yet another feature of retractable display system and method of use is its ability to provide a lift mechanism configured to assemble and disassemble the plurality of releasably interlinked display subassemblies from the rack system into an interlinked large display.

Yet another feature of retractable display system and method of use is its ability to provide a lift mechanism configured to raise and lower the assembled large display to enable on-site height adjustment of the assembled display.

Yet another feature of retractable display system and method of use is its ability to provide an alignment system configured to align the plurality of releasably interlinked display subassemblies into an interlinked seamless display.

Yet another feature of retractable display system and method of use is its ability to provide a support structure configured to support the plurality of releasably interlinked display subassemblies.

Yet another feature of the retractable display system and method of use is its ability to provide large displays that can be quickly (in minutes) transported and utilized in a variety of locations and by minimally trained personnel.

Yet another feature of the retractable display system and method of use is its ability to provide a large seamless display of interlinked display subassemblies.

Yet another feature of retractable display system and method of use is its ability to provide a significantly reduced cost per use of large displays and to make them more available to more locations on economical basis without the requirement to have multiple trained technicians available for transportation, assembly and operation.

Yet another feature of the retractable display system and method of use is its ability to provide a self-contained retractable large display system suitable for transportation and shipping so that all of the parts are in one container to function properly as an unfolded and linked seamless large display without the requirement of technicians or others skilled workers in the video display installation and operation.

Yet another feature of the display system and method of use is its ability to provide two or more display systems side-by-side configured without a seam between the displays.

Yet another feature of the display system and method of use is its ability to provide a display with display subassemblies that fold, link, hinge, pivot, roll or the like out of a transport box and the assembled display is at least two times (2×) the height or more than the individual display subassemblies and/or its transport box.

Yet another feature of the display system and method of use is its ability to provide a system for facilitating virtual presence.

Yet another feature of the display system and method of use is its ability to provide an audio system integrated with the display, including a wireless microphone and speakers to further provide a mobile audio and visual presentation system.

Yet another feature of the display system and method of use is its ability to provide a system with no visible seam or bezels in the display area.

Yet another feature of the display system and method of use is its ability to provide a rugged commercial floor display.

Yet another feature of the display system and method of use is its ability to provide a bump resistant display and shipping container.

Yet another feature of display system and method of use is its ability to provide a light weight and easily portable large display system.

Yet another feature of the display system and method of use is its ability to provide a battery powered and rechargeable display system, which is not dependent on the availability of power at the viewing location.

Yet another feature of the display system and method of use is its ability to provide an onboard media player wherein a removable storage device, such as a thumb drive, may be plugged into the media player to quickly display or modify the content on the retractable display system.

Yet another feature of the display system and method of use is its ability to provide a built in receiver or transmitter to collect external data to enable a viewer to interact with, provide feedback to, and/or integrate an image with the display system, such as one or more cameras to integrate an image of the viewer with the content being displayed on the display or to engage a viewer of the display system to interact with, provide feedback, and/or purchase a product/service offering.

Yet another feature of the display system and method of use is its ability to provide touch screen functionality integrated into the display.

Yet another feature of the display system and method of use is its ability to provide shrouding or trim to hide the display support structure.

Yet another feature of the display system and method of use is its ability to provide any size retractable display.

Yet another feature of the display system and method of use is its ability to provide a self-contained, pre-wired, automatically retractable display contained in a roll able transport box.

Yet another feature of the display system and method of use is its ability to provide stored panels of displays that automatically unpacks the displays and assembles a vertical display larger than the transport box.

Yet another feature of the display system and method of use is its ability to provide a vertical display larger than the transport box that automatically disassembles into display panels and packs the display panels in the transport box.

Yet another feature of the display system and method of use is its ability to provide a large display disassembled as display subassemblies in a transport box that automatically, by push of a button, erects and assembles through electrical, mechanical or other means the display subassemblies into a large seamless display at least two times higher than any one individual display subassembly.

Yet another feature of the display system and method of use is its ability to provide a large display that self-folds into transport box, wherein the transport box is substantially smaller in height than the height of the deployed large display verses prior displays where the display and transport box were the same size or wherein the two or more interlinked display panels is taller (greater in height) than the transport box.

Yet another feature of the display system and method of use is its ability to provide a mobile display that is easy to transport or move into position by a single operator.

Yet another feature of the display system and method of use is its ability to utilize LCD, LED, OLED, Qdots, or other like display technology to provide a display system.

These and other features of the retractable display system and method of use will become more apparent to one skilled in the art from the following Brief Description of the Drawings, Detailed Drawings, Detailed Description and Claims when read in light of the accompanying drawings.

BRIEF DESCRIPTION OF THE DRAWINGS

The present retractable display system and method of use or the like will be better understood by reading the Detailed Description of the embodiments with reference to the accompanying drawings, in which like reference to numerals denote similar structures and refer to like elements throughout, and in which.

It is to be noted that the drawings presented are intended solely for the purpose of illustration and that they are, therefore, neither desired nor intended to limit the disclosure to any or all of the exact details of construction shown, except insofar as they may be deemed essential to the claimed invention.

DETAILED DESCRIPTION

In describing the exemplary embodiments of the present disclosure, as illustrated in FIGS. 1-16 specific terminology is employed for the sake of clarity. The present disclosure; however, is not intended to be limited to the specific terminology so selected, and it is to be understood that each specific element includes all technical equivalents that operate in a similar manner to accomplish similar functions. Embodiments of the claims may; however, be embodied in many different forms and should not be construed to be limited to the embodiments set forth herein. The examples set forth herein are non-limiting examples, and are merely examples among other possible examples.

For purposes of teaching and not limitation, the exemplary embodiments disclosed herein are discussed mainly in the context of LED light emitter technologies. However, the present invention is applicable to other light emitting technologies as well, such as, by way of example and not limitation, light emitting diodes (LED), liquid crystal display (LCD), backlit LCDs, organic light emitting diodes (OLED), electroluminescence, plasma tubes or cells, plasma display panels (PDP), and the like.

Figure 1:
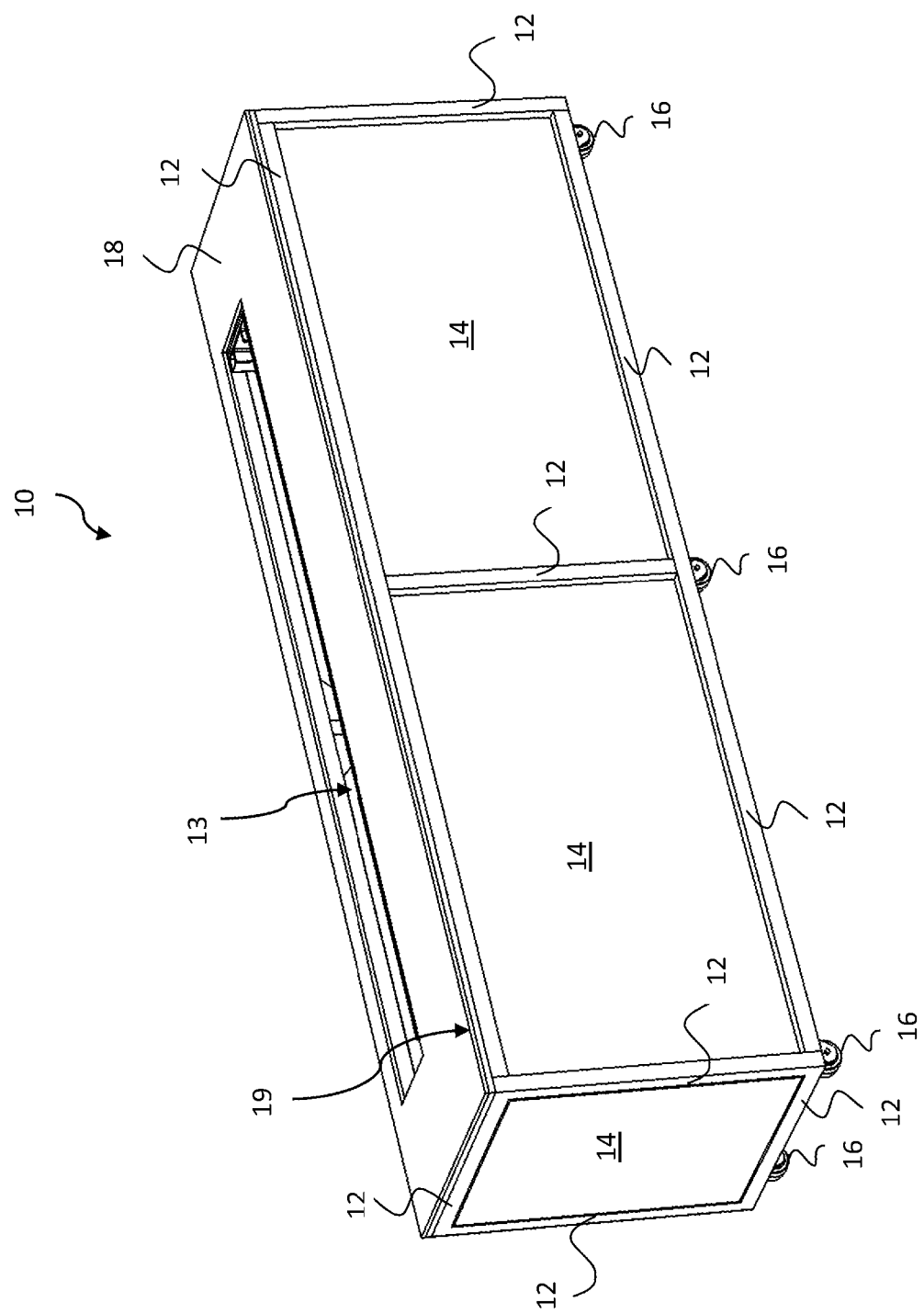
FIG. 1 is a perspective front view of an exemplary transport box.
Figure 2:
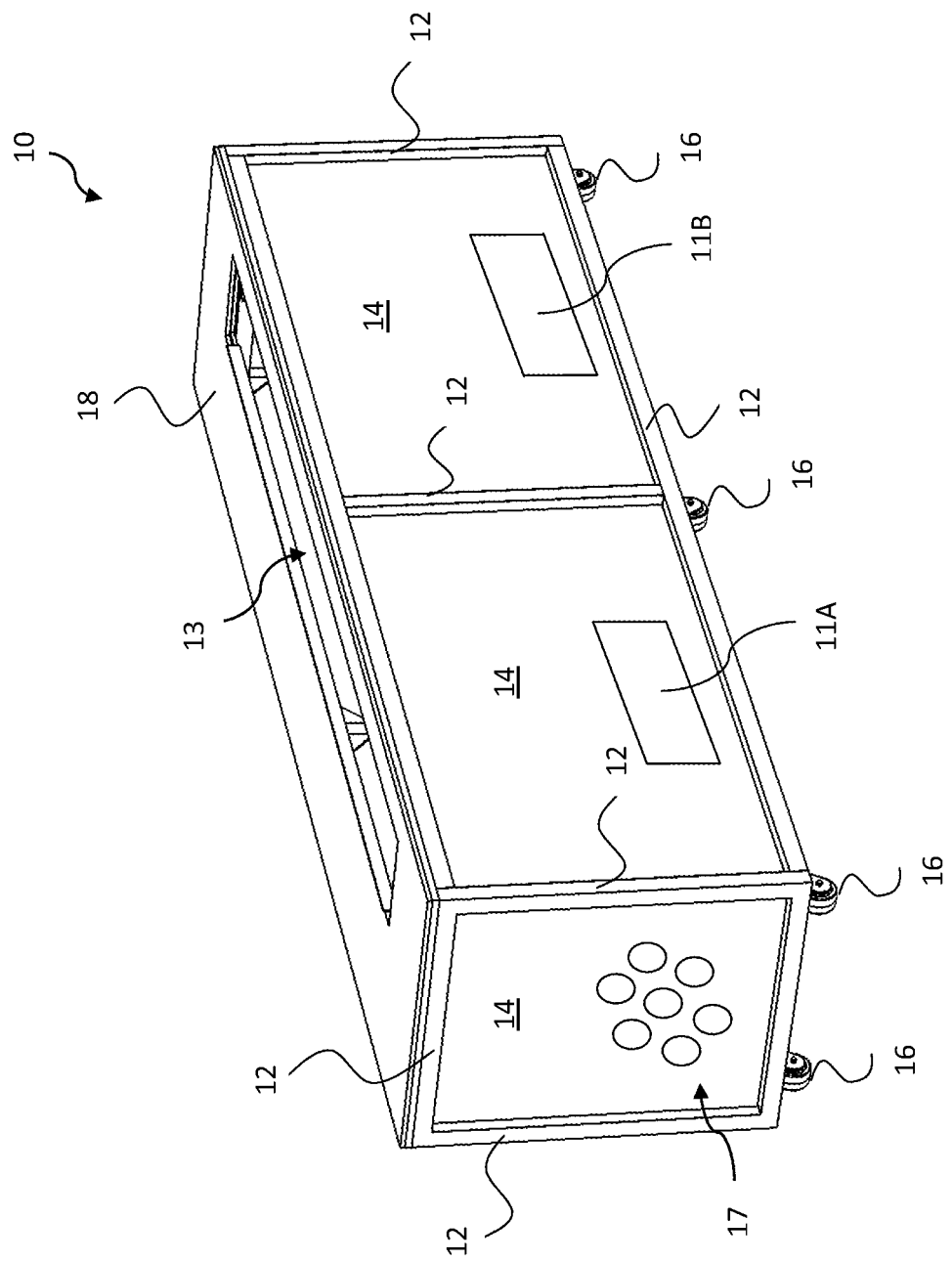
FIG. 2 is a perspective back view of the exemplary transport box of FIG. 1.

Referring now to FIGS. 1 and 2 by way of example, and not limitation, there is illustrated an example embodiment of the container, case, housing, or storage unit, such as transport box 10. Preferably, transport box 10 includes support structure, edge, or panel mount, such as frame 12 configured to form the framework or perimeter frame support of an enclosure, a plurality of sides, surfaces, such as panels 14 supported and affixed to frame 12 and configured to create sides walls of an enclosure, two or more wheels or rollers, such as casters 16 configured to permit transport box 10 to be readily moved by rolling transport box 10 from place to place. Casters 16 are preferably removeably affixed to frame 12 (likely on its underside) and provide contact support to a surface viewing area, such as the floor. Alternatively, casters 16 may be positioned or releasably affixed approximate to panels 14 or frame 12. Frame 12 may be configured as solid or hollow member(s) having tubular or rectangular beam cross-section or the like to permit frame 12 to support its contents, erect structure and data cabling to run therein. Moreover, transport box 10 preferably includes top, cap, or closure, such as lid 18 configured to open and close about a hinge or joint, such as pivot member 19 configured as one or more pivot sections between frame 12 and lid 18, and to enable lid 18 to pivot about one member of frame 12 between an open and closed position. Preferably lid 18 includes hole, access, or slot, such as aperture 13 an entrance and exit port for internal systems within transport box 10.

Furthermore, transport box 10 may include one or more lift or extension retraction mechanisms, such as actuator whether mechanical, electrical, hydraulic, or air actuated or the like positioned between frame 12 or panels 14 and lid 18. Preferably, actuator enables automatic opening and closing of lid 18. Preferably transport box 10 further includes lock, fastener, closure, or catch, such as latch whether mechanical, electrical, hydraulic, or air actuated or the like and configured to releasably lock frame 12 or panels 14 to lid 18. Moreover, transport box 10 preferably includes covered openings, such as access panels 11 (A and B) positioned in panels 14 to provide access inside transport box 10 other than through lid 18 or aperture 13 for servicing or access to internal hardware of retractable display system 20, power cables, control devices, data, up/down switches, power on/off and the like.

It is contemplated herein that transport box 10 may be utilized to transport, store, protect, move or support a display system and its sub systems, such as retractable display system 20 or subassemblies or panels thereof.

Moreover, frame 12 may be integrated with panels 14 to form a support panel configured as transport box 10. As may be contemplated herein frame 12 and/or panels 14 may serve as enclosure for housing hardware such as lift mechanisms, rack structures, computer, power supplies, power cords, a wireless microphone, an audio/video player, and audio output device(s), such as speaker 17 positioned approximate frame 12 and panels 14 and utilized in conjunction with retractable display system 20. It is contemplated herein that configurations other than shown for transport box 10 and/or frame 12 and panels 14 may be utilized herein or others known to one of ordinary skill in the art.

Frame 12, lid 18, panels 14, and moveable support structure 32 are preferably formed, molded or configured from a suitable material, such as expanded metal, aluminum, sheet metal, plastic, or alternative resin, fiber, reinforced fiber, wood, stainless steel, rigid support material or the like and any manufacturing method, capable of providing structure to frame 12, lid 18, and panels 14. Preferably, the material includes other suitable characteristics, such as strength, rigidity, durability, water-resistance, light weight, smooth surface, textured surface, soft or impact resistant surface, paintability, chemical inertness, oxidation resistance, safety, ease of portability, longevity, or other beneficial characteristic understood by one skilled in the art.

Referring again to FIGS. 1 and 2 and FIG. 3 of US Patent Application entitled "Mobile Personsize Display System and Method of Use (incorporated by reference herein) by way of example, and not limitation, there is illustrated an example embodiment of caster 16. Preferably caster 16 is an un-driven, single, double, or compound wheel designed to be mounted to the bottom or underside of frame 12 and panels 14. Caster 16 is preferably configured to enable transport box 10 to be easily moved from place to place. Caster 16 is available in various sizes and shapes and may be made of rubber, plastic, nylon, aluminum, or stainless steel. Preferably caster 16 further includes a brake, such as lock mechanism to enable locking of casters 16 to prevent the wheel from turning and prevent retractable display system 20 from being rolled about and the unlocking thereof lock mechanism to enable the rolling of transport box 10 from place to place. Furthermore, caster 16 may be rigidly affixed to base 12 or pivotally affixed to base 12 via pin to enable 360 degrees of rotation, thus enabling the wheel to roll in any direction.

As will be appreciated, the various embodiments of transport box 10 provide substantial benefits in terms of the mobility and manipulation of systems contained within transport box 10. In particular, both the display and all supporting devices and the like may be readily transported from place to place without the need to disconnect components.

It is further contemplated herein that trademarks, product logos, or other product branding identifiers, such as indicia may be positioned on the surface of frame 12, lid 18, and panels 14.

Figure 3:
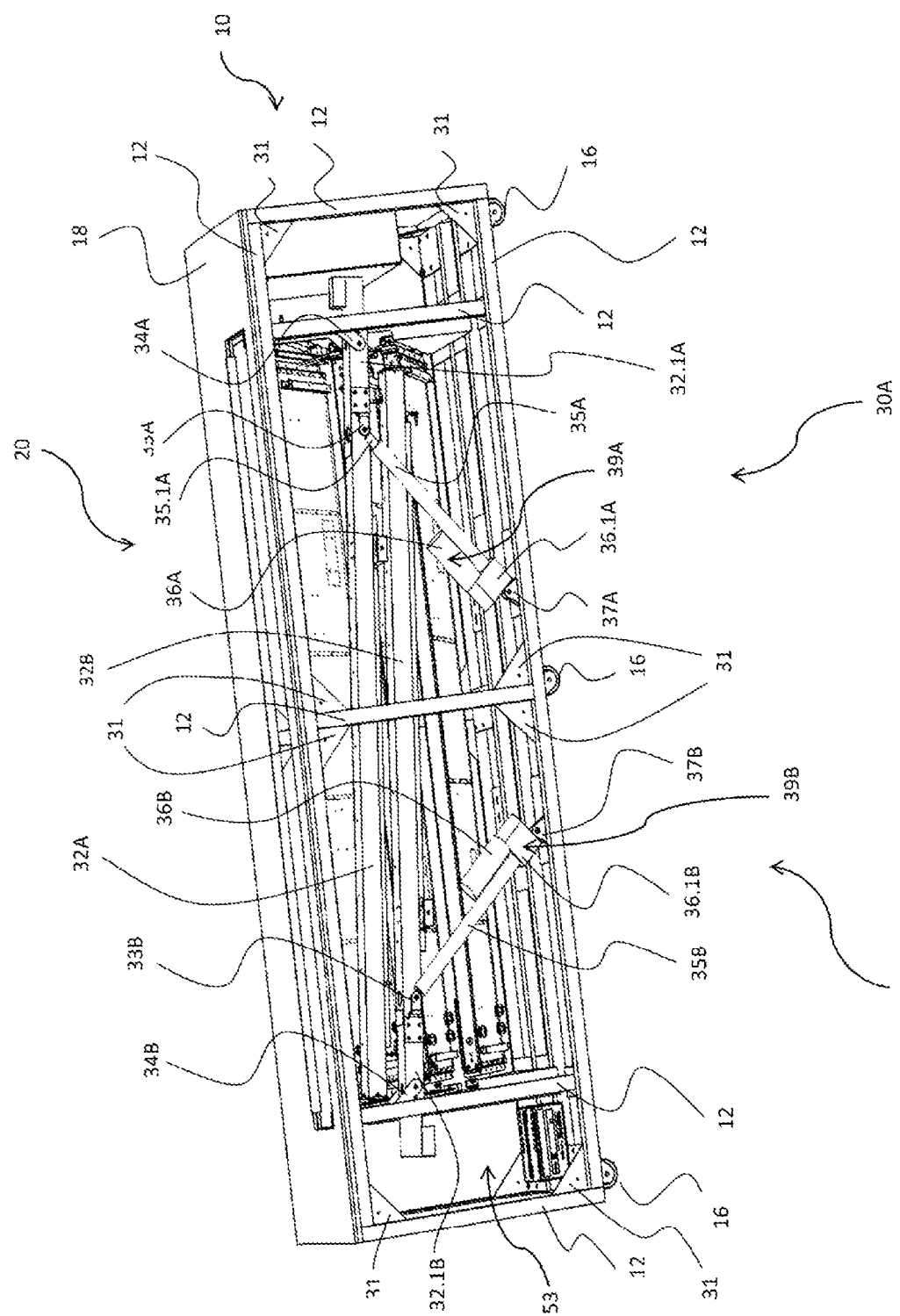
FIG. 3 is a perspective internal view of the exemplary transport box of FIG. 2, shown with panels removed and hardware within.

Referring now to FIG. 3 by way of example, and not limitation, there is illustrated an example embodiment of the extendable/retractable, hinged, linked, or roll able display system, such as retractable display system 20. Preferably, retractable display system 20 includes, perimeter and center frame 12 configured with panel connection plates 31, and/or additional frame 12 to support, affix or fasten thereto one or more moveable support structure and lift mechanism, and combined herein as, combined support structure and lift mechanism 30.

Preferably support structure and lift mechanism 30 includes one or more brace, stud, post, pole or the like, whether pivotable or telescopic, such as moveable support structure 32 having base end 32.1 pivotally affixed to internal frame 12 by first pivot member 34, shown as a bracket affixed to frame 12 and pin or bolt positioned therethrough. Moreover, moveable support structure 32 pivots about first pivot member 34 from an approximately horizontal position (as shown) to an approximately upright, elevated, or vertical position (shown in FIGS. 4 and 5) by the operation of drive mechanism 39. Preferably, support structure drive mechanism 39 is pivotally affixed on one end 39.1 to base end 32.1 of moveable support structure 32 by second pivot member 34, shown as a bracket affixed to base end 32.1 and pin or bolt positioned therethrough. On the other end 39.2, preferably support structure drive mechanism 39 is pivotally affixed to internal frame 12 by third pivot member 37, shown as a bracket affixed to frame 12 and pin or bolt positioned therethrough. It is contemplated herein that pivot members may be single or multi-piece brackets or the like that enable pivot rotation. It is further contemplated herein that moveable support structure 32 may be configured as a single unit, one or more extendable or retractable units, or telescopic.

Figure 4:
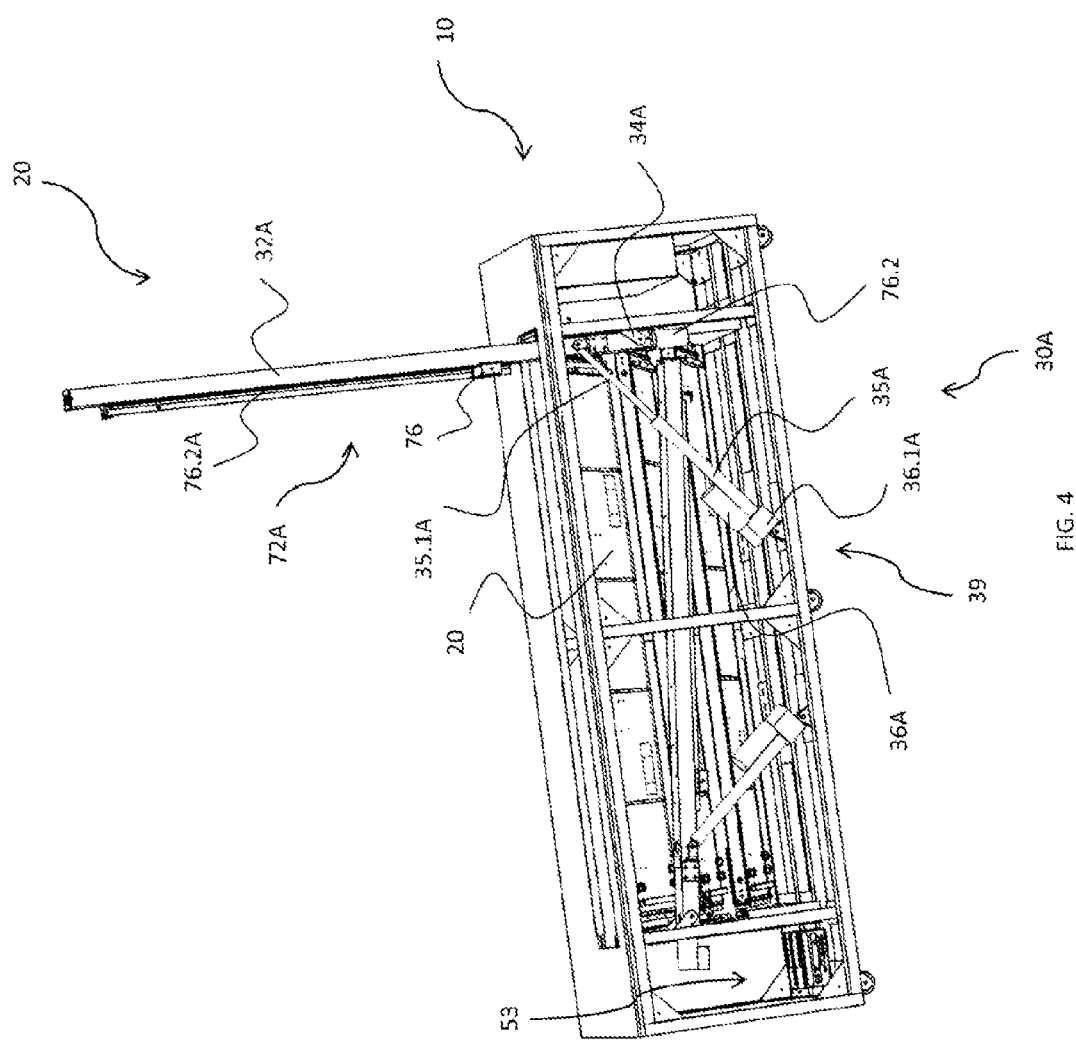
FIG. 4 is a perspective internal view of the exemplary transport box of FIG. 3, shown with one support arm extended.
Figure 5:
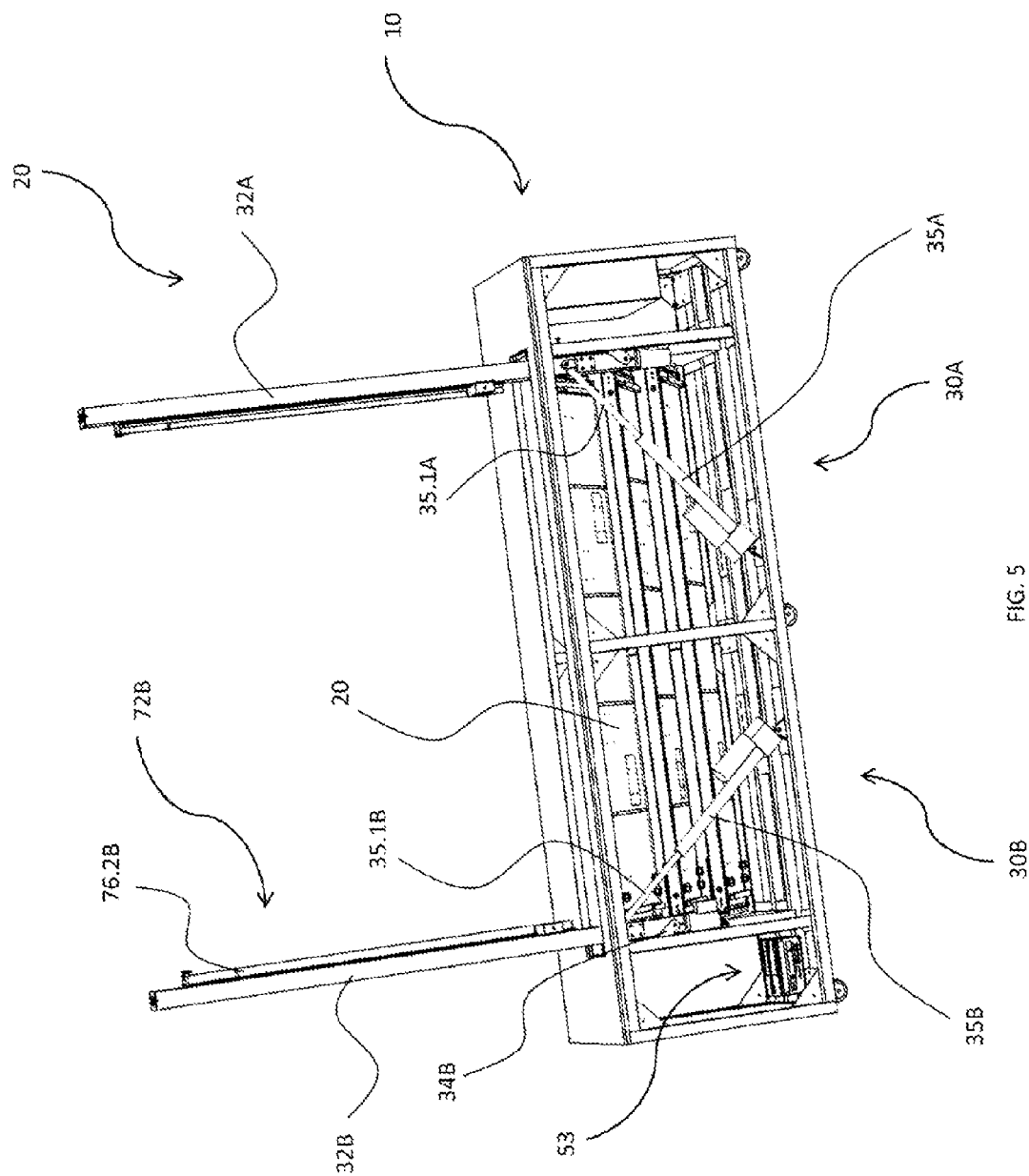
FIG. 5 is a perspective internal view of the exemplary transport box of FIG. 3, shown both support arms extended.

Referring now to FIGS. 4 and 5 by way of example, and not limitation, there is illustrated an example embodiment of drive mechanism 39 in operation. In use, support structure drive mechanism 39 positions support structure 32 between an approximately horizontal position (as shown in FIG. 3) to an approximately upright or vertical position (shown in FIGS. 4 and 5). Moreover, support structure drive mechanism 39 further includes motor 36, worm gear or gear box 36.1, shaft 35, and extension/retraction rod 35.1. Preferably, to rotate support structure 32 from the horizontal position (as shown) to an approximately upright or vertical position (shown in FIGS. 4 and 5), motor 36, drives worm gear or gear box 36.1, and rotation causes extension/retraction rod 35.1 to extends from shaft 35, and to pivot support structure 32 about second pivot member 34 and to rotate support structure 32 to an approximately upright or vertical position (shown in FIGS. 4 and 5). Likewise, in reverse operation, to preferably rotate support structure 32 from upright or vertical position (shown in FIGS. 4 and 5) to the horizontal position (as shown in FIG. 3) motor 36, drives worm gear or gear box 36.1, and rotation causes extension/retraction rod 35.1 to retract into shaft 35, to pivot support structure 32 about second pivot member 34 and to rotate support structure 32 to an approximately horizontal position (as shown in FIG. 3). It is further contemplated herein that support structure drive mechanism 39 of support structure and lift mechanism 30 may alternatively include motor, sprocket or pulley and chain or belt, scissor lift, or may be substituted with a compressed air cylinder, hydraulic cylinder or other like drive mechanism and structure drive mechanism 39 may alternatively be a vertically positioned compressed air cylinder, hydraulic cylinder or other like drive mechanism, to lift, raise, elevate, lower, store, or support display and/or its subassemblies.

Referring again to FIG. 4 by way of example, and not limitation, there is illustrated an example embodiment of retractable display system 20 shown with support structures 32A in the approximate upright or vertical position ready to lift, align and/or support retractable display system 20 or other like display system. Preferably, extension/retraction rod 35.1A of support structure and lift mechanism 30A extends from shaft 35A to pivot support structure 32A about second pivot member 34A and to rotate support structure 32A to an approximately upright or vertical position.

Referring again to FIG. 5 by way of example, and not limitation, there is illustrated an example embodiment of retractable display system 20 shown with support structures 32A and 32B in the approximate upright or vertical positions ready to lift, align and/or support retractable display system 20 or other like display system. Preferably, extension/retraction rod 35.1B of support structure and lift mechanism 30B extends from shaft 35B to pivot support structure 32B about second pivot member 34B and to rotate support structure 32B to an approximately upright or vertical position.

Referring again to FIGS. 3, 4 and 5 by way of example, and not limitation, there is illustrated an example embodiment of electrical, electro-mechanical, electronic, controllers, and other systems 53 to drive audio and video content for display on retractable display system 20 and to operate and control, such as control systems of retractable display system 20. Preferably hardware, programmable logic controllers, relays, wiring panels, and other systems 53 to control operation of combined support structure and lift mechanism 30 may be housed internal to, affixed to frame 12, lid 18, or panels 14 or positioned on an exterior surface of panels 14 and/or frame 12 of transport box 10 or positioned remotely from retractable display system 20 or the like. Moreover, other systems 53 preferably includes audio/video content (data) player and distribution system, such as media player 40, shown in FIG. 4 and its written description in US Patent Application entitled "Mobile Personsize Display System and Method of Use (incorporated by reference herein), may be housed internal to, affixed to frame 12, lid 18, or panels 14 or positioned on an exterior surface of panels 14 and/or frame 12 of transport box 10 or positioned remotely from retractable display system 20 or the like. Media player 40 operating digital signage software is preferably utilized to control digital imagery, such as television programming, video content, menus, information, advertising and other visual data, viewable on retractable display system 20. It is further contemplated herein that other media players and/or storage technologies known now or in the future to one of ordinary skill in the art are incorporated herein.

It is still further contemplated herein that media player 40 and its subsystem, components, connectors, and software may be re-configured and made compatible for operation with the one or more display sub-assemblies 54 of the one or more display panels 62 (shown in FIG. 6) of retractable display system 20.

It is still further contemplated herein that other systems 53 preferably includes DC power supply system 50 (portable power supply system), shown in FIG. 5 and its written description in US Patent Application entitled "Mobile Personsize Display System and Method of Use (incorporated by reference herein), may be housed internal to, affixed to frame 12, lid 18, or panels 14, or positioned on an exterior surface of panels 14 and/or frame 12 of transport box 10 or positioned remotely from retractable display system 20 or the like. DC power supply system 50 is preferably configured to deliver constant voltage, current, and/or power to regulator boards 52 to power LEDs, such as one or more display sub-assemblies 54 and other systems 53 of retractable display system 20. It is contemplated herein that DC power supply system 50 enables retractable display system 20 to be transported and operated independent of AC power feeds or supply.

It is still further contemplated herein that DC power supply system 50 and its subsystem, connectors, components, and software may be re-configured and made compatible for operation with the one or more display sub-assemblies 54 of the one or more panels 14 of retractable display system 20.

Figure 6:
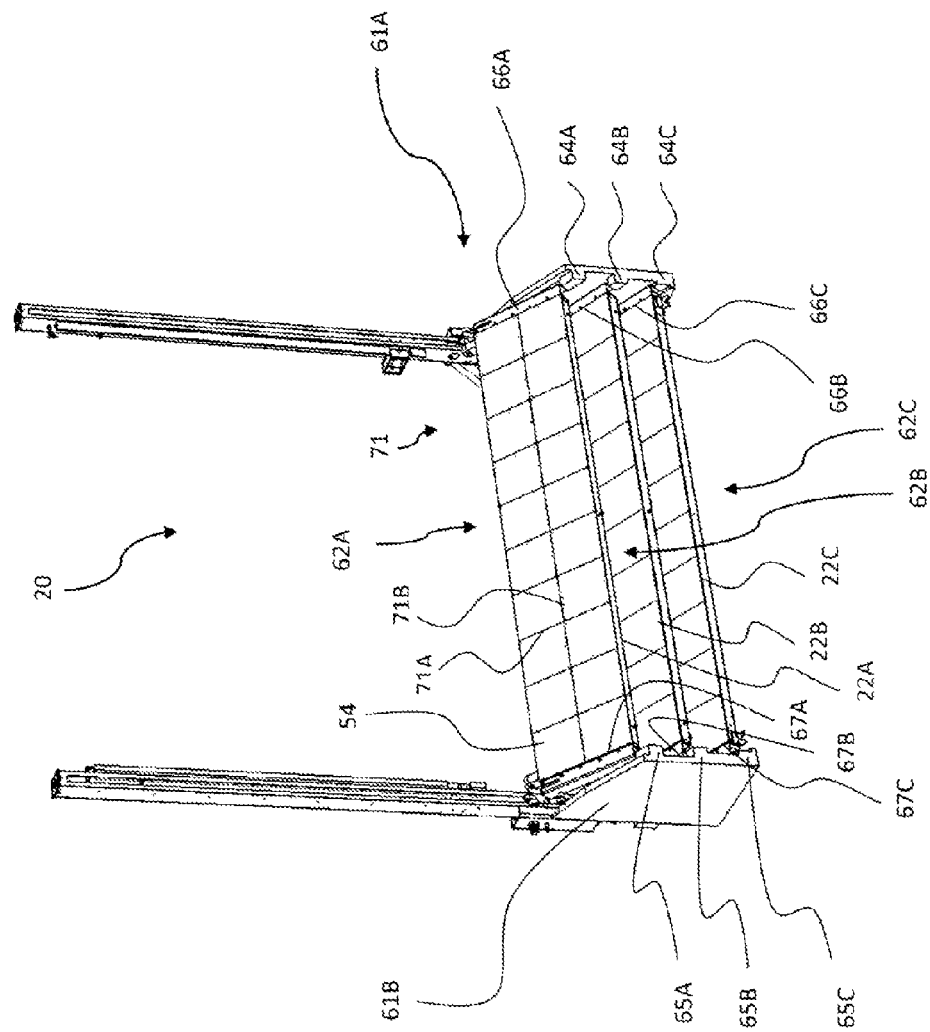
FIG. 6 is a perspective front view of an exemplary retractable display system, shown with transport box removed.

It is still further contemplated herein that other systems 52 preferably includes AC power supply system 60 (portable power supply system), shown in FIG. 6 and its written description in US Patent Application entitled "Mobile Personsize Display System and Method of Use (incorporated by reference herein) may be housed internal to, affixed to frame 12, lid 18, or panels 14 or positioned on an exterior surface of panels 14 and/or frame 12 of transport box 10 or positioned remotely from retractable display system 20 or the like. AC power supply system 60 is preferably configured convert AC power to DC and to deliver constant voltage, current, and/or power to regulator boards 52 to power LEDs, such as one or more display sub-assemblies 54 and other systems 52 of retractable display system 20.

It is still further contemplated herein that AC power supply system 60 and its subsystem, connectors, components, and software may be re-configured and made compatible for operation with the one or more display sub-assemblies 54 of the one or more panels 14 of retractable display system 20.

Referring now to FIG. 6 by way of example, and not limitation, there is illustrated an example embodiment of retractable display system 20. Preferably retractable display system 20 preferably includes a monitor or display configured from one or more sub displays, such as display panels 62A, 62B, 62C, whether single sided or two sided with front display and back display, retractable display system 20, includes light emitting diodes (LED), organic light emitting diodes (OLED), and including as, by way of example and not limitation, liquid crystal display (LCD), backlit LCDs, Qdots, electroluminescence, plasma tubes or cells, or plasma display panels (PDP) (light emitters), and other light emitting technologies, any display technology or display modules known to one of ordinary skill in the art, touch screen technology, all included as retractable display system 20 or subassemblies or panels thereof and configured to display images, read input information (touch screen) or other audio/video content or data and display such information and data thereon.

It is still further contemplated herein that display panels 62A, 62B, 62C preferably includes back panel to form a support cover, such as pan 22A, 22B, 22C configured to support, hold in position, and/or incase one or more or a plurality of display sub-assemblies 54. Moreover pan 22A, 22B, 22C preferably includes inner panel, surface, frame or cross bars, such as sub-frame 71 supported by pan 22, and further includes vertical members 71A and horizontal members 71B configured to cross one another forming a lattice framework to releasably affix each of one or more display sub-assemblies 54 thereto. Moreover, each of one or more display sub-assemblies 54 is releasably affixed to vertical members 71A and/or horizontal members 71B by magnetic M connection or other like attachment mechanisms. Pan 22 and sub-frame 71, shown in FIGS. 2 and 7 and its written description in US Patent Application entitled "Mobile Personsize Display System and Method of Use are incorporated by reference herein.

Referring again to FIG. 6 by way of example, and not limitation, there is illustrated an example embodiment of one or more displays, such as display panels 62A, 62B, 62C shown in a system to organize, support, load, pack, shelf, and/or store within transport box 10, such as rack system 61. Rack system 61 preferably includes a plurality of spaced support surface 64 and 65 configured to organize, support, load, pack, shelf, and/or store display panels 62A, 62B, 62C. Preferably, support surface 64A and 65A organize, support store and the like for display panels 62A, support surface 64B and 65B organize, support store and the like for display panels 62B, and support surface 64C and 65C organize, support store and the like for display panels 62C. Preferably, rack system 61A and 61B may be housed internal to, affixed to frame 12, lid 18, or panels 14 or the like. Moreover, display panels 62A, 62B, 62C preferably includes a display panels bracket assembly to support display panels 62A, 62B, 62C, configured with first bracket end 66 and second bracket end 67 affixed on opposite ends of each of display panels 62. Preferably, first bracket end 66A of display panels 62A is preferably configured to contact and/or be guided by first guide support surface 64A affixed to frame 12 of transport box 10, and second bracket end 67A of display panels 62A is preferably configured to contact and/or be guided by second guide support surface 65A affixed to frame 12 of transport box 10. Furthermore, first bracket end 66B of display panels 62B is preferably configured to contact and/or be guided by first guide support surface 64B, and second bracket end 67B of display panels 62B is preferably configured to contact and/or be guided by second guide support surface 65B. Still furthermore, first bracket end 66C of display panels 62C is preferably configured to contact and/or be guided by first guide support surface 64C, and second bracket end 67C of display panels 62C is preferably configured to contact and/or be guided by second guide support surface 65C.

It is contemplated herein that each guide support surface 64 and 65 may be off set or staggered from each other support surface pair, such as support surface 64A and 65A, support surface 64B and 65B, and support surface 64C and 65C being off set to enable only one of display panels 62A, 62B, 62C to fit therein guide support surface 64 and 65. Moreover, each offset support surface 64 and 65 preferably enables storage of display panels 62A, 62B, or 62C in a matching pair of support surfaces 64 and 65, whether A, B, or C, respectively, when retractable display system 20 is in its storage position shown in FIG. 6.

Figure 7:
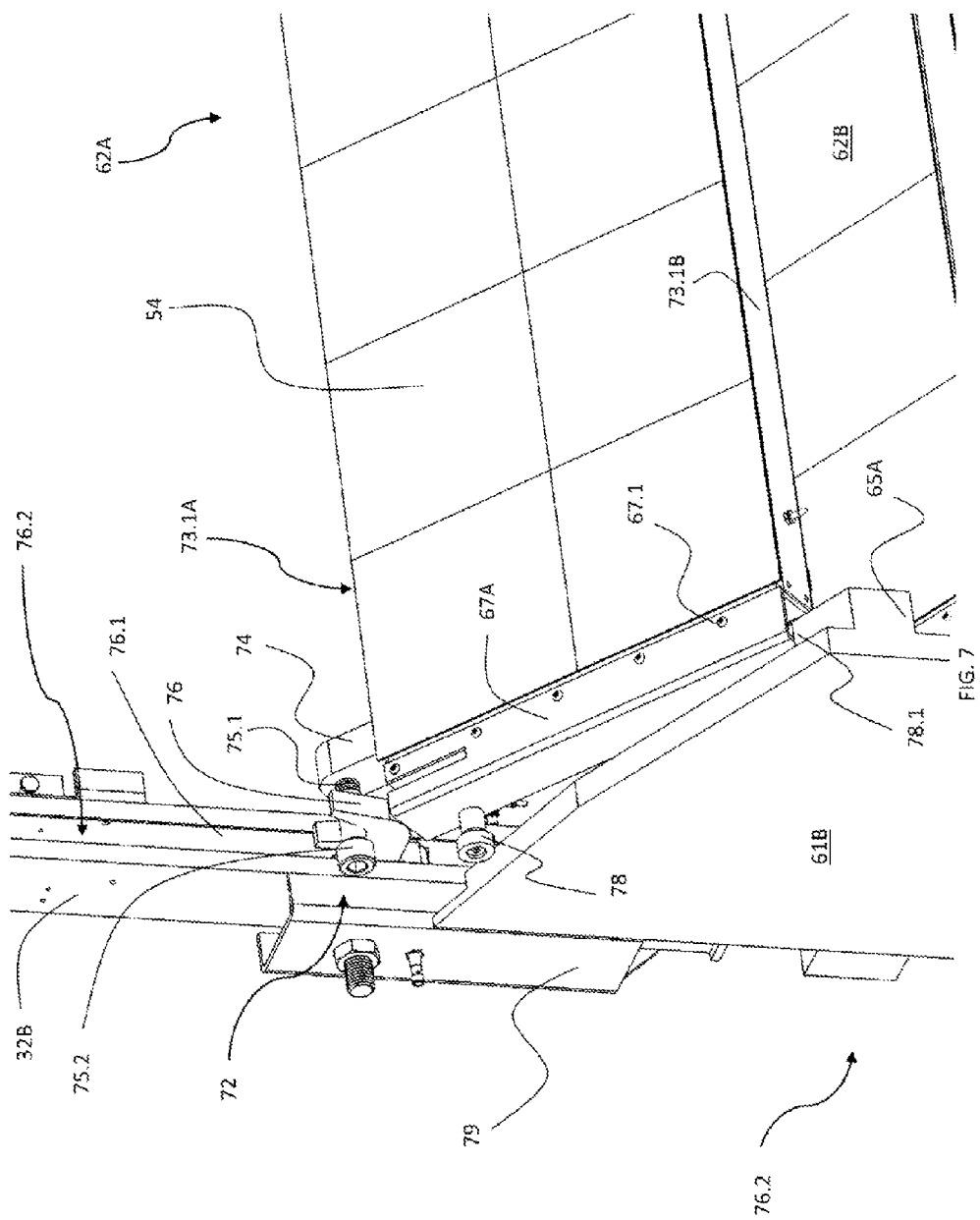
FIG. 7 is a perspective front view of an exemplary retractable display system, shown with lift hook engaging a first display panel.

Referring now to FIG. 7 by way of example, and not limitation, there is illustrated an example embodiment of display panels 62A. Preferably, second bracket end 67A and first bracket end 66A of display panels 62A includes a limb or appendage, such as arm 74 configured to extend from a front edge 73.1A of display panels 62A or alternatively be affixed to second bracket end 67A and first bracket end 66A. Moreover, arm 74 includes a bolt, rod, peg, or hanger, such as dowel 75.2 shown approximately perpendicular to arm 74 and threaded into an aperture 75.1 in arm 74. It is contemplated herein that dowel 75.2 may be affixed to arm 74 such as by welding, adhesive or otherwise or formed as a apart of arm 74.

In use support structures 32A and 32B preferably includes lift mechanism 77, which includes a hanger or catch, such as hook 76 for vertical lift and lower of one or more display panels 62. Preferably, hook 76 travels in a slot, slit, or aperture, such as groove 76.1 configured in support structures 32. Hook 76 preferably traverses in groove 76.1 by motor and chain drive or belt drive lift system 76.2 or the like imbedded in support structures 32A and 32B or positioned exterior to support structures 32A and 32B. It is contemplated herein that lift system 76.2 may include one or more raise or lower retraction mechanisms, such as an actuator whether mechanical, electrical, hydraulic, or air actuated or the like. Preferably, lift system 76.2 enables automatic raise or lower of display panels 62A. Furthermore, second bracket end 67A and first bracket end 66A of display panels 62A may include one or more rollable, protruding, or slidable device, such as rollers 78 and 78.1 whether internal or external to second bracket end 67A and first bracket end 66A of display panels 62A. Preferably, rollers 78 and 78.1 are configured to efficiently guide second bracket end 67A and first bracket end 66A of display panels 62A along support surface 64 and 65.

It is contemplated herein that support surface 64 and 65 and second bracket end 67A and first bracket end 66A may include brackets, rollers and other slide assembly's therebetween.

It is contemplated herein that display panels 62A, 62B, 62C may include a storage system, such as a bracket configured to be positioned on display panels 62A, 62B, 62C and operate between display panels 62A, 62B, 62C to organize and safely store display panels 62A, 62B, 62C.

Figure 8:
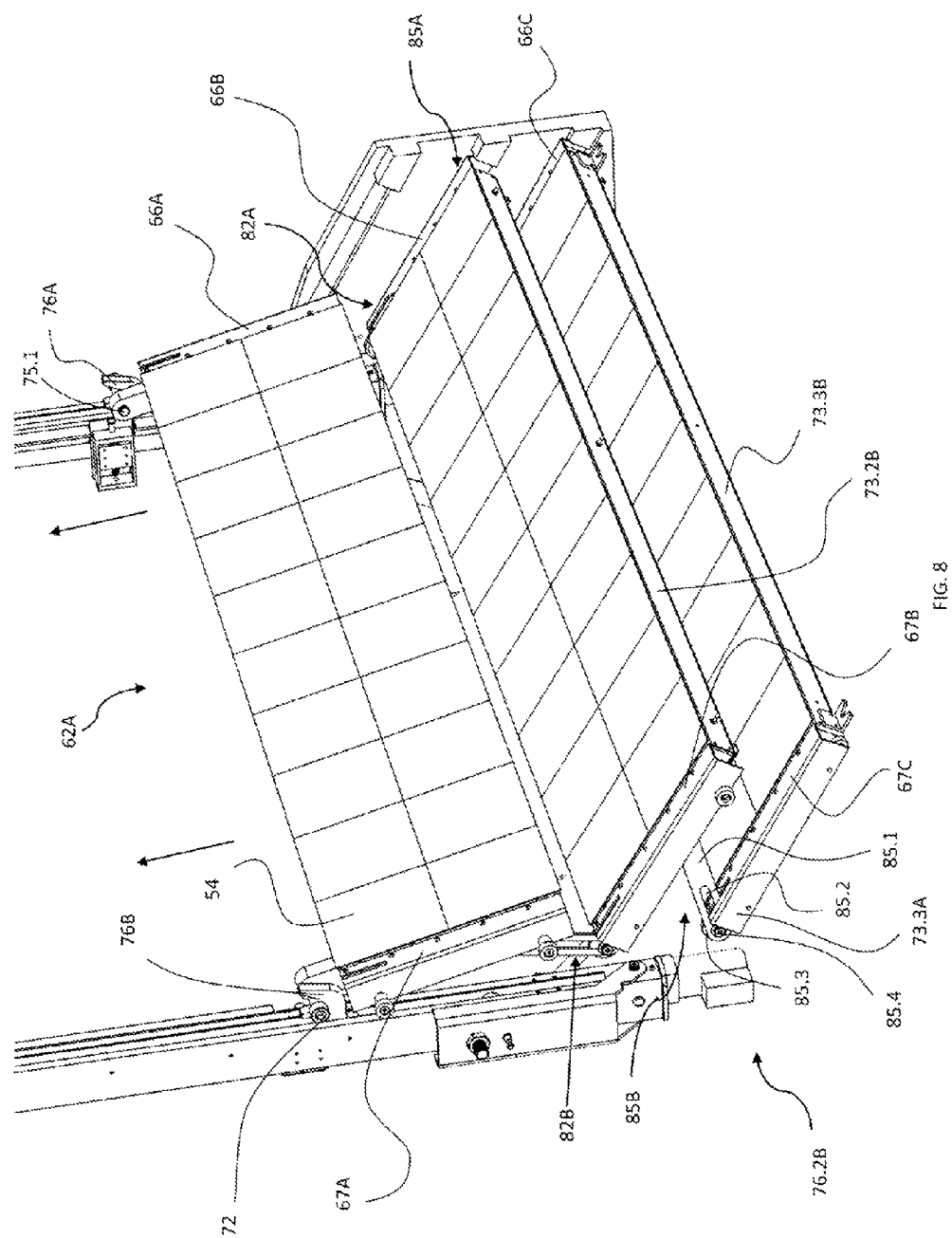
FIG. 8 is a perspective front view of an exemplary retractable display system, shown with lift hook lifting the display and mechanical interlinks between display panels.

Referring now to FIG. 8 by way of example, and not limitation, there is illustrated an example embodiment of display panels 62A transitioning from an angled lateral storage position to a vertical display position. Preferably, display panels 62A and 62B, 62B and 62C are yoked, hinged, interlinked, or linked together by linkage assembly 82 and 85, respectively. For example, linkage assembly 85 includes a limb or appendage, such as arm 85.3 configured to extend from a front edge 73.3A of display panels 62C or alternatively affixed to second bracket end 67C and first bracket end 66C. Moreover, linkage assembly 85 includes first pivot member 85.4 positioned on arm 85.3 and slidably affixes thereto slot 85.2 formed in one end of linkage arm 85.1 and second pivot member 85.6 is preferably affixed to the underside of second bracket end 67B to second pivot member 85.4. In use for display, each display panels 62A and 62B, 62B and 62C are yoked or linked together by linkage assembly 82 and 85 and lifted in tandem together with display panels 62A; first lift system 76.2 lifts hook 76, which engages arm 74 to lift display panels 62A; and with linkage assembly 82 linking display panels 62A and display panels 62B, thereafter display panels 62B is preferably tandem lifted by lift system 76.2 from an angled lateral storage position to a vertical display position; and with linkage assembly 85 linking display panels 62B and display panels 62C, thereafter display panels 62C is preferably tandem lifted by lift system 76.2 from an angled lateral storage position to a vertical display position.

It is further contemplated herein that display panels 62A and 62B, 62B and 62C may be yoked or linked together by other linkage assemblies, such as cables, chains, air or hydraulic struts, spring dampening devices and the like.

It is still further contemplated herein that display panels 62A and 62B, 62B and 62C may be yoked or linked together to enable display panels 62A, 62B, 62C to swing into the upright position and roll into the storage position without the display panels contacting one another.

Figure 9:
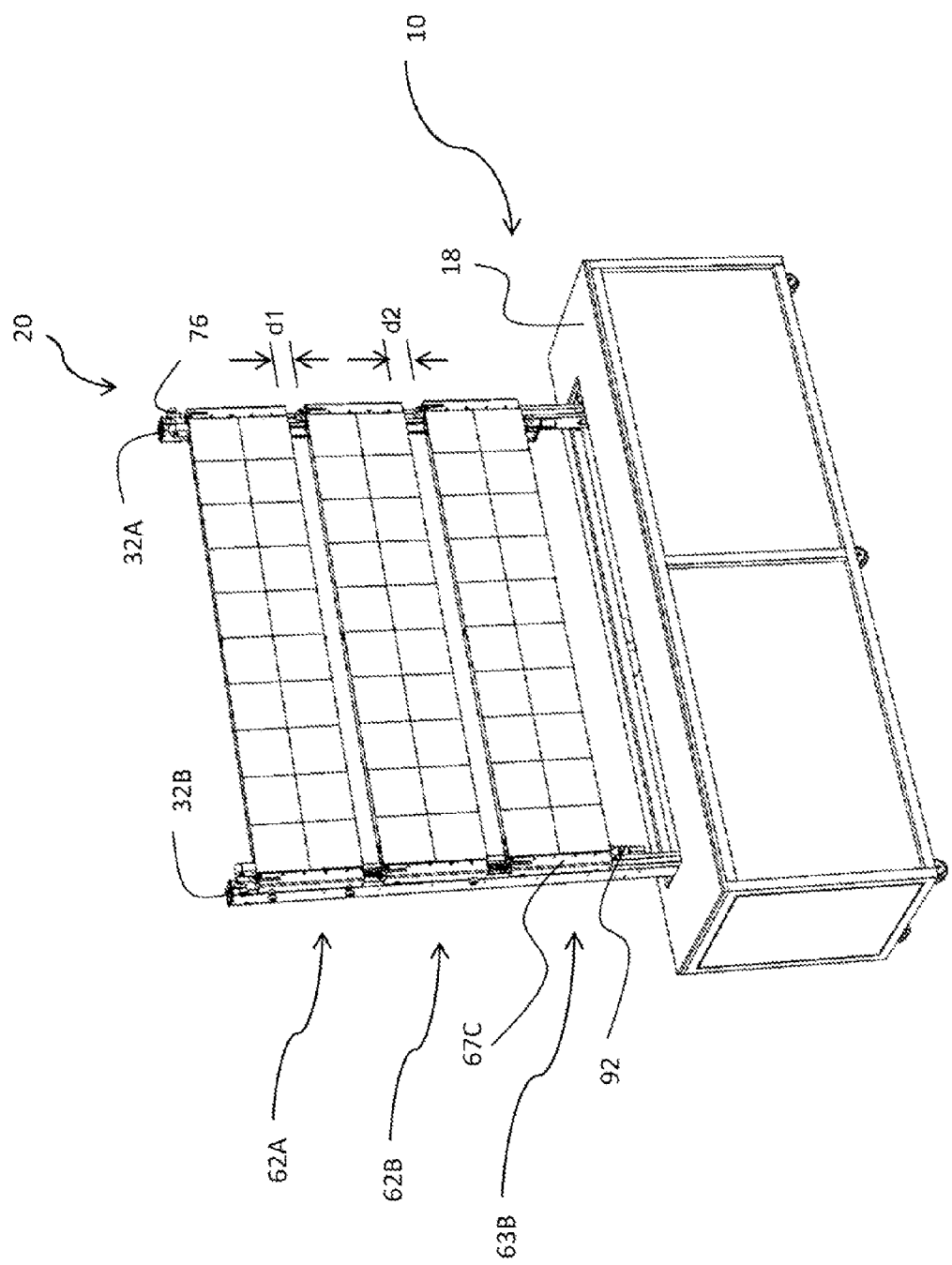
FIG. 9 is a perspective front view of an exemplary retractable display system, shown with display panels in an upright position.

Referring now to FIG. 9 by way of example, and not limitation, there is illustrated an example embodiment of display panels 62A, 62B, 62C transitioned to a vertical display position supported by support structures 32A and 32B. Preferably, display panels 62A, 62B, 62C are shown upright with yoke or link gap d1 between linked display panels 62A and 62B and yoke or link gap d2 between linked display panels 62B and 62C. Moreover, display panels 62A, 62B, 62C are preferably lifted as a linked assembly by lift system 76.2 and lift hook 76 to a position above lid 18 of transport box 10 or more specifically above stop device, brake device or the like, such as stop assembly 92.

Figure 10:
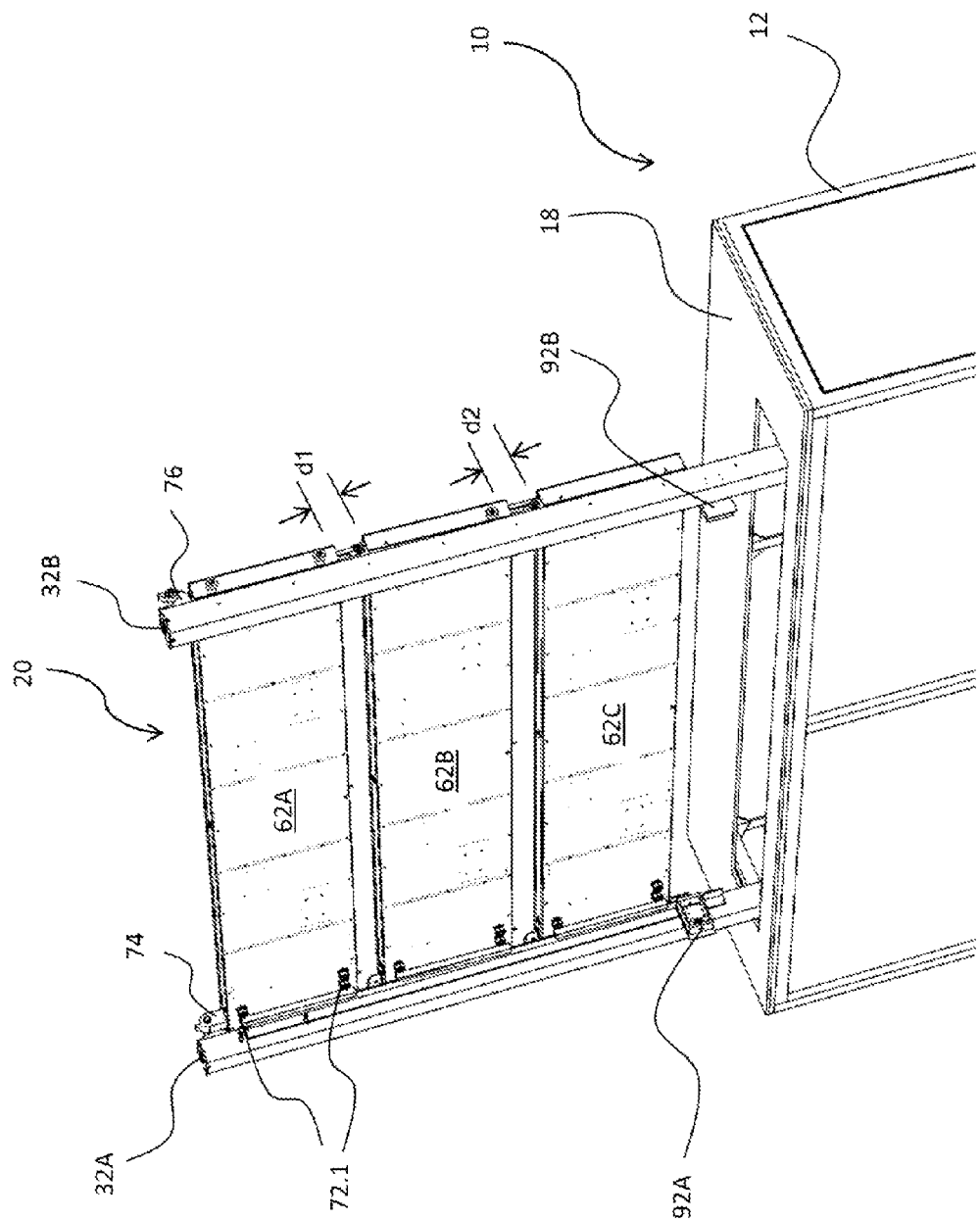
FIG. 10 is a perspective back view of an exemplary retractable display system, shown with display panels in an upright position.

Referring now to FIG. 10 by way of example, and not limitation, there is illustrated an example embodiment of display panels 62A, 62B, 62C transitioned to a vertical display position supported by support structures 32A and 32B. Preferably, display panels 62A, 62B, 62C are shown upright with yoke or link gap d1 between linked display panels 62A and 62B and yoke or link gap d2 between linked display panels 62B and 62C. Moreover, linked display panels 62A, 62B, 62C are preferably lifted as a linked assembly by lift system 76.2 and lift hook 76 to a position above lid 18 of transport box 10 or more specifically above stop device, brake device or the like, such as stop assembly 92. Furthermore, stop assembly 92A is preferably positioned on support structures 32A approximate lid 18 and stop assembly 92A is preferably positioned approximate lid 18 on support structures 32A. It is contemplated herein that stop assembly 92 may be positioned on frame 12, lid 18, bracket end 67 and/or bracket end 66C.

Figure 11:
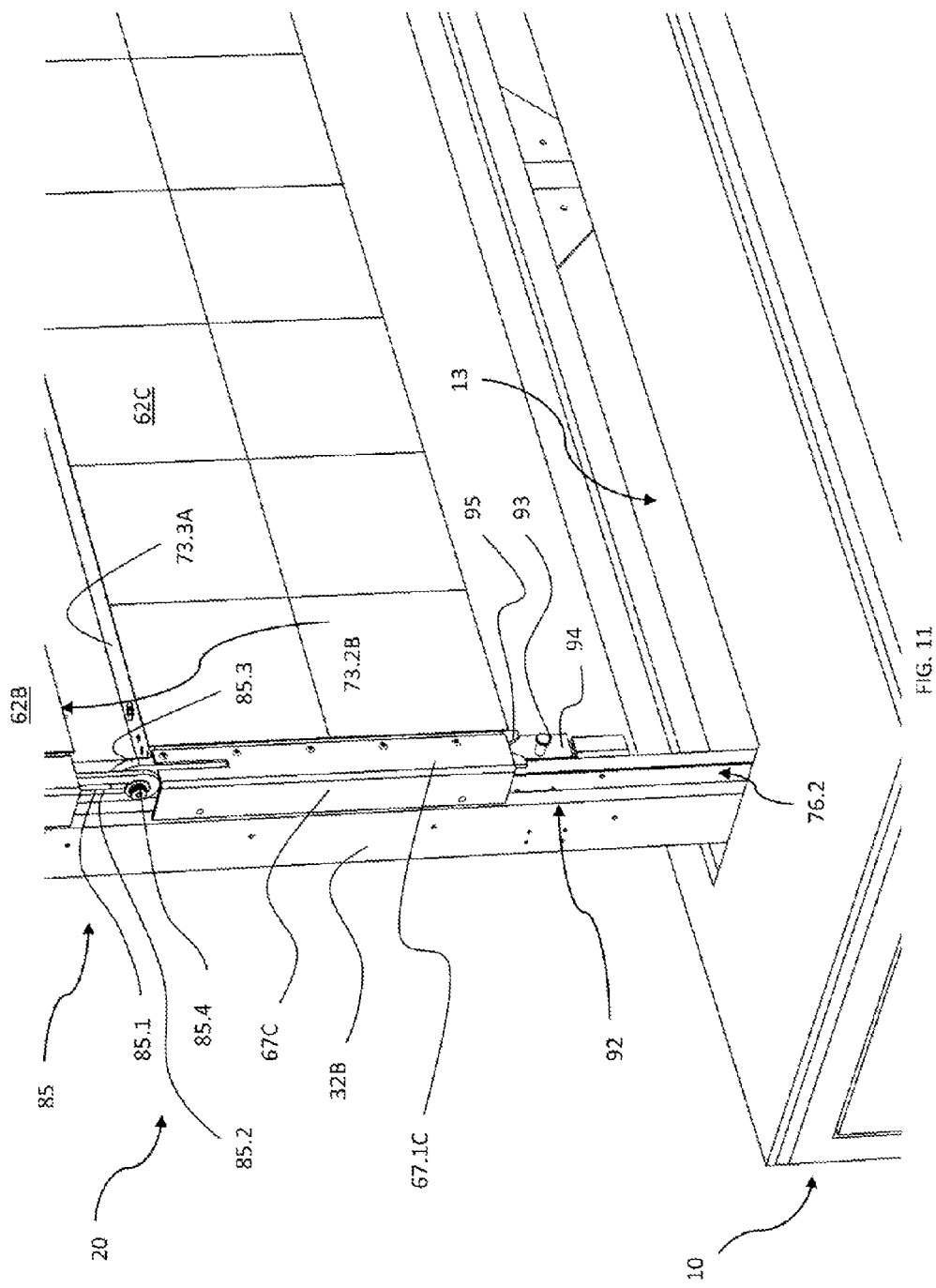
FIG. 11 is a perspective front view of an exemplary retractable display system, shown with display panels in an upright position with linkage assembly and stop assembly.

Referring now to FIG. 11 by way of example, and not limitation, there is illustrated an example embodiment of display panels 62A, 62B, 62C transitioned to a vertical display position above stop assembly 92. Preferably, stop assembly 92 includes housing 94, pin, latch, catch, or bolt, such as actuator pin 93 positioned on support structures 32 approximate lid 18, and notched guide plate 95 affixed to a lower end 67.1 of bracket end 67C and/or 66C. Moreover, display panel 62B and display panel 62C are linked together by linkage assembly 85 with yoke or link gap d2 between linked display panels 62B and 62C. In use, display panels 62A, 62B, 62C are preferably lifted above or beyond stop assembly 92 and actuator pin 93, whereby stop assembly 92 is preferably activated, electro-mechanically or otherwise, to extend actuator pin 93 from housing 94. Next, lift system 76.2 and lift hook 76 lower linked display panels 62A, 62B, 62C, whereby notched guide plate 95 of display panels 62C seats, comes to a stop, or resting position on actuator pin 93 of stop assembly 92 (in display position), and pivot member 85.4 of display panels 62C slides through slot 85.2 formed in one end of linkage arm 85.1 of display panels 62B, whereby display edge 73.2B of display panels 62B comes in contact with display edge 73.3A of display panels 62C closing link gap d2 between linked display panels 62B and 62C (in display position). Likewise, linkage assembly 82 between linked display panels 62A and 62B collapses or closes, whereby display edge 73.1B of display panels 62A comes in contact with display edge 73.2A of display panels 62B closing link gap d1 between linked display panels 62A and 62B (in display position).

Figure 12:
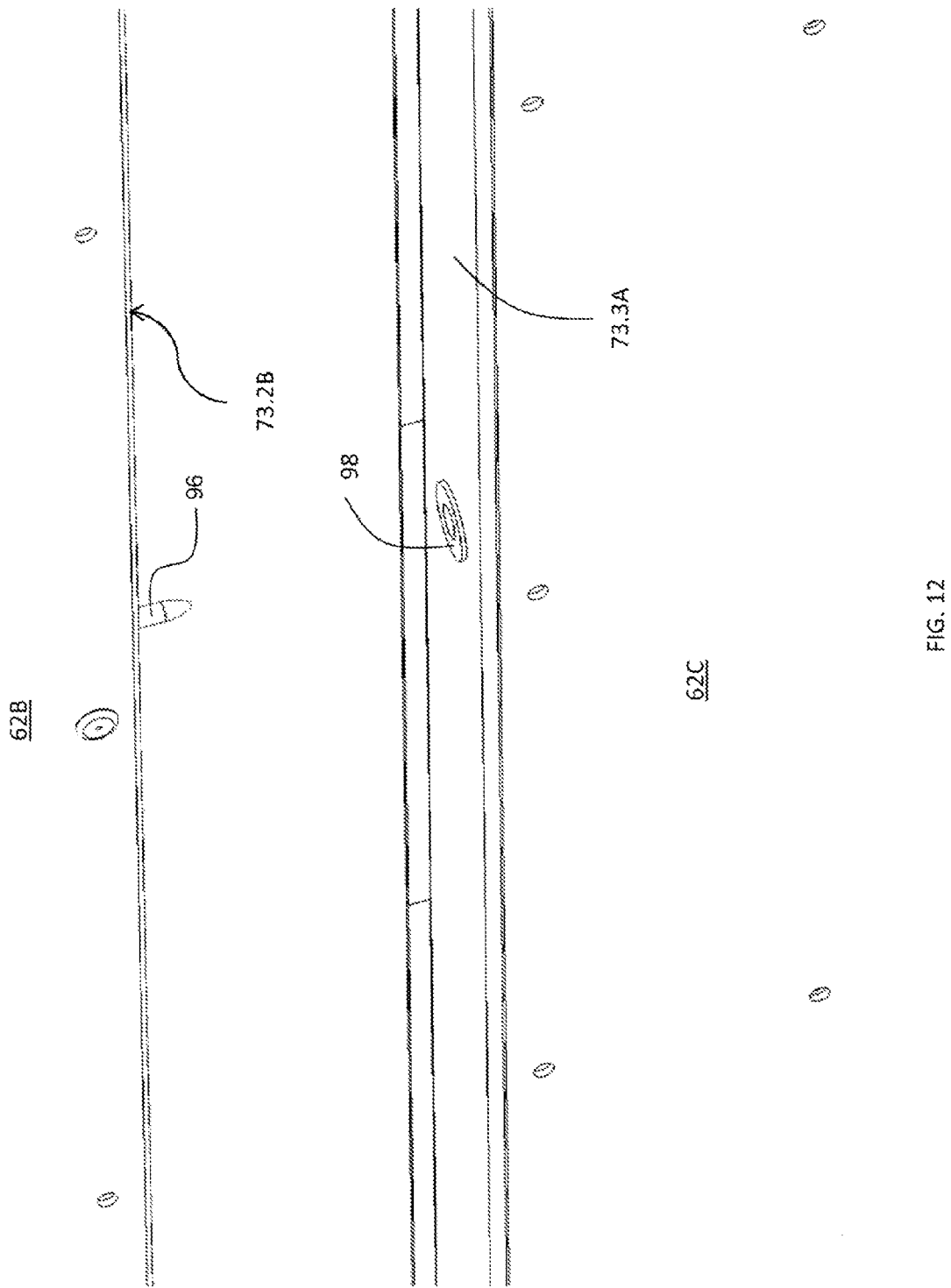
FIG. 12 is a perspective front view of an exemplary retractable display system, shown with display panels with an alignment device.

Referring now to FIG. 12 by way of example, and not limitation, there is illustrated an example embodiment of an auto alignment device 99 to align display panels 62B and 62C. Preferably, alignment device 99 includes male member, alignment pin, or protrusion, such as tip 96 positioned on display edge 73.2B of display panels 62B and female member, such as aperture 98 positioned on display edge 73.3A of display panels 62C, whereby when display edge 73.2B of display panels 62B comes in proximity to display edge 73.3A of display panels 62C closing link gap d2 between linked display panels 62B and 62C tip 96 inserts therein aperture 98 to align display panels 62B and 62C. Such alignment provides a uniform display between linked display panels 62A, 62B, 62C to create a large seamless display from linked display panels 62A, 62B, 62C.

Figure 13:
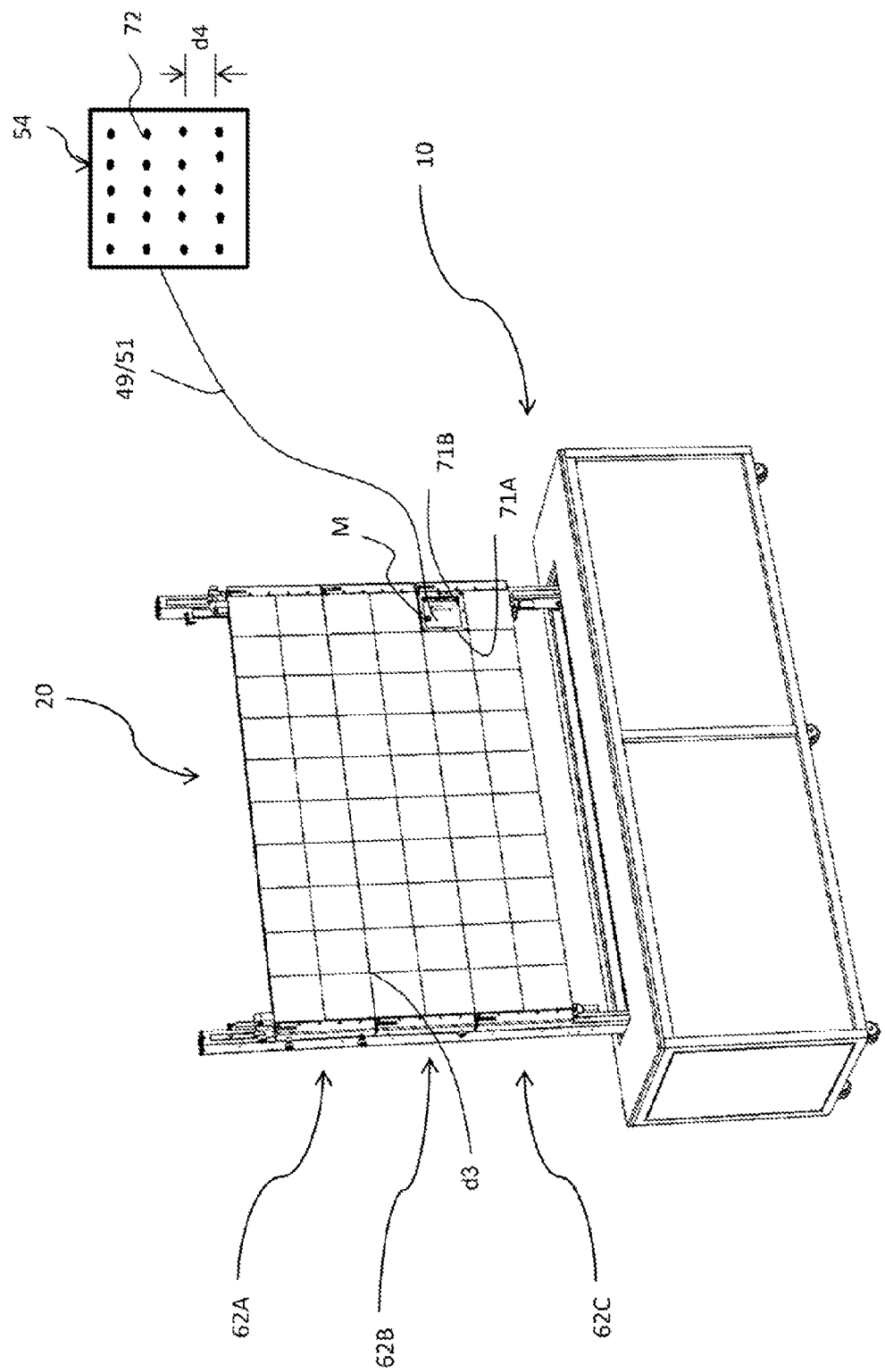
FIG. 13 is a perspective front view of an exemplary retractable display system, shown with seamless display panels configured as a large display.

Referring now to FIG. 13 by way of example, and not limitation, there is illustrated an example embodiment of linked display panels 62A, 62B, 62C to form large seamless retractable display system 20 unfolded in the display position. Preferably, retractable display system 20 automatically transitions between folded storage position and unfolded display position, shown via other systems 53 to drive audio and video content for display on retractable display system 20 and to operate and control, such as control systems of retractable display system 20.

Referring again to FIG. 13 by way of example, and not limitation, there is illustrated an example embodiment of retractable display system 20. Preferably, retractable display system 20 includes pan 22 and inner panel, surface, frame or cross bars, such as sub-frame 71 supported by pan 22, and further includes vertical members 71A and horizontal members 71B configured to cross one another forming a lattice framework to releasably affix each of one or more display sub-assemblies 54 thereto. Moreover, each of one or more display sub-assemblies 54 is releasably affixed to vertical members 71A and/or horizontal members 71B by magnetic M connection or other the like attachment mechanisms. For example, if vertical members 71A and horizontal members 71B are formed of steel or other ferrous material then magnets M may be affixed to the perimeter of each of one or more display sub-assemblies 54 to releasably affix each of one or more display sub-assemblies 54 to vertical members 71A and/or horizontal members 71B. Alternatively, if vertical members 71A and horizontal members 71B are formed of aluminum or other nonferrous material then magnets or the like may be affixed to vertical members 71A and horizontal members 71B and magnets M or the like may be affixed to the perimeter of each of one or more display sub-assemblies 54 to releasably affix each of one or more display sub-assemblies 54 to vertical members 71A and/or horizontal members 71B. It is contemplated herein that sub-frame 71 may be configured other than as lattice framework. It is further contemplated herein that other attachment mechanisms may be utilized herein to releasably affix of one or more display sub-assemblies 54 to vertical members 71A and/or horizontal members 71B. Moreover, one or more display sub-assemblies 54 (10×6=60 shown) are preferably assembled to form linked display panels 62A, 62B, 62C of retractable display system 20. One or more display sub-assemblies 54 are preferably connected via one or more connector, cable, wire or the like, such as data ribbon cable 49 and/or DC cable assembly 51, a standard data communication and/or power multi-wire cable and connectors between electronic devices and other hardware 53.

It is contemplated herein that assembled display shown in FIG. 13 is at least two times (2×) the height or more than the height of individual display subassemblies 54 and/or the height of transport box 10.

Preferably, one or more display sub-assemblies 54 includes one or more pixels or cells, such as light emitters 72 including light emitting diodes (LED) or other light emitting technologies, such as, by way of example and not limitation, liquid crystal display (LCD), backlit LCDs, electroluminescence, plasma tubes or cells, or plasma display panels (PDP), organic light emitting diode (OLED) and the like (light emitters 72) In an exemplary embodiment, light emitters 72 are preferably sized relative to pixel gap d4 so that the gap line between light emitters 72 is less noticeable while still providing a desired resolution for sub-assemblies 54 and retractable display system 20. For example, each light emitter 72 of one or more display sub-assemblies 54 may include P 4.0 mm DOT Matrix Nixel 64×32 resolution LED or other light source known to one of ordinary skill in the art. Preferably, light emitter 72 are positioned distance d1 between each neighboring light emitter 72 configured as an array or matrix of light emitter 72 to form each of one or more display sub-assemblies 54.

Preferably, each display sub-assemblies 54 positioned therein retractable display system 20 is configured having a space therebetween, such as sub-assembly gap d3. In a preferred embodiment, sub-assembly gap d3 between neighboring sub-assemblies 54 is preferably approximately equal to pixel gap d4 between individual light emitters 72 of one of one or more display sub-assemblies 54, such that pixel gap d1 and sub-assembly gap d2 is less noticeable or seamless to an observer.

In an exemplary embodiment of one or more display sub-assemblies 54, light emitter 72 are preferably of a size relative to the pixel gap d4 to make the pixel gap line less noticeable to a viewer. For example, the pixels may be of a size relative to the size of pixel gap d4 so as to provide a display of a desired resolution in which pixel gap d4 is not as pronounced or distracting to the viewer. Moreover, sub-assembly gap d3 is preferably of a size approximately equal to the pixel gap d4 to make sub-assembly gap d3 less noticeable or seamless to a viewer. This relationship and sizing may depend on a number of factors, including, but not limited to, viewing distance, contrast ratio, brightness, and viewing environment.

One problem with prior art displays is that sub-assembly gap d3 is of such size that gap lines are visible in the resulting display which is distracting to a viewer and renders an image of poorer quality. It is contemplated herein that if sub-assembly gap d3 is to close or narrow then a bright line may appear between a perimeter row of light emitter 72 and if sub-assembly gap d3 is too far apart or wide dark line may appear between a perimeter row of light emitter 72, thus such gaps would be noticeable to and distracting to a viewer. Alternatively, because there are no light emitters 72 to produce light at sub-assembly gap d3, the gap may appear as a darkened area of a display, referred to as a "pixel gap line."

It is contemplated herein that if sub-assembly gap d3 is equal pixel gap d4 or if such gaps vary by no more than +/−20% from equal (d3=d4) (equal) then such gaps are preferably less noticeable to and distracting to a viewer.

It is contemplated herein that distance d4 between each neighboring light emitter 72 may include 1 mm to 10 mm depending on the desired resolution, viewing distance and acceptable price point for retractable display system 20.

It is contemplated herein that retractable display system 20 and/or its one or more display sub-assemblies 54 may incorporate touch screen technology to integrate feedback from a viewer of retractable display system 20.

It is still further contemplated herein that retractable display system 20 may include displays on one or more sides of retractable display system 20.

It is still further contemplated herein that retractable display system 20 may include one or more audio/still/video, microphone, digital or video camera, capture devices, sensors or other transmitters or receivers, and/or touch screen technology, such as capture device 15 for added functionality (functionality). Preferably, one or more capture device 15 may be integrated into the pixel matrix of flat panel display 18 and/or one or more display sub-assemblies and utilized to capture images and/or audio of persons, objects and/or background imagery and sound or other content or data, such as environmental data created within the surroundings of retractable display system 20 (functionality).

It is contemplated herein that capture device 15 may include a single sensor device disposed within the active visual area of retractable display system 20 or multiple sensor devices disposed within the active visual area of retractable display system 20. The type, number, and position of the capture device 15 may vary depending on the application. In the preferred embodiment, capture devices 15 are populated at varying heights and widths within the active visual area to capture multiple images to generate a full perspective image for display, storage, and/or distribution.

It is still further contemplated herein that retractable display system 20 may enable placement of visual imagery, presentation materials and content, advertising materials, audio/video and/or other content and/or educational materials on retractable display system 20, which may provide a viewer with help, instructions, education, motivation, and/or information or other functionality set forth in US Patent Application entitled "Mobile Personsize Display System and Method of Use (incorporated by reference herein) (functionality).

It is contemplated herein that retractable display system 20 and/or one or more display sub-assemblies 54 or display panels 62 may incorporate touch screen technology to integrate feedback from retractable display system 20.

Referring now to FIGS. 6-12 by way of example, and not limitation, there is illustrated an example embodiment of retractable display system 20. Preferably, to stow, fold, or collapse retractable display system 20 first lift system 76.2 lifts hook 76, which lifts display panels 62A, whereby display panels 62A and 62B separate to provide link gap d1 between linked display panels 62A and 62B. With continued lift from first lift system 76.2 lifts hook 76 linkage assembly 82 expands to its linkage limit, which lifts linked display panels 62B, whereby display panels 62B and 62C separate to provide link gap d2 between linked display panels 62B and 62C. With continued lift from first lift system 76.2 lifts hook 76 linkage assembly 85 expands to its linkage limit, which lifts linked display panels 62C and tandem linked display panels 62A and 62B above stop assembly 92, whereby actuator pin 93 may be retracted into housing 94. Next, lift system 76.2 lowers hook 76, which lowers linked display panels 62A, 62B, 62C, whereby display panel 62C lowers and rolls into its angled lateral storage position of support surfaces 64C and 65C of rack system 61; next display panel 62B lowers and rolls into its angled lateral storage position of support surfaces 64B and 65B of rack system 61, and display panel 62A lowers and rolls into its angled lateral storage position of support surfaces 64A and 65A of rack system 61. Preferably, rack system 61 includes a plurality of spaced support surface 64 and 65 configured to organize, support, load, pack, shelf, and/or store display panels 62A, 62B, 62C.

Figure 14:
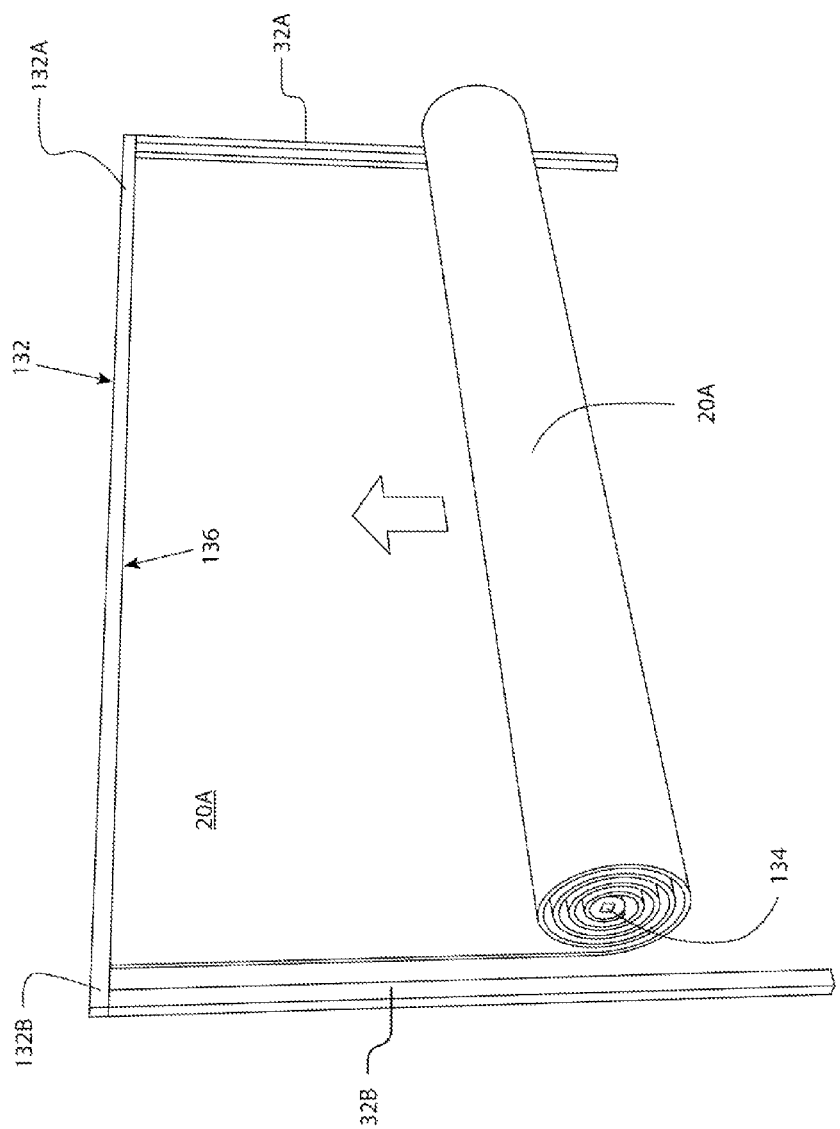
FIG. 14 is a perspective front view of an alternate flexible display system, shown rolled up on a reel.

Referring now to FIG. 14 by way of example, and not limitation, there is illustrated an alternate example embodiment of flexible display system 20A. Preferably, flexible display system 20A is supported by a support structure, such as horizontal support structure 132 configured with first end 132A and second end 132B. Moreover, first end 132A is preferably affixed to vertical support structure 32A and second end 132B is preferably affixed to vertical support structure 32B. In storage, flexible display system 20A is rolled up and stored on roll, cylinder, spool, or tube, such as reel 134. Preferably, upper edge 136 of flexible display system 20A is affixed to support structure 132. In display mode, flexible display system 20A is preferably unrolled off of reel 134 and vertically lifted when support structure 132 is lifted vertically. Flexible display system 20A includes the systems and subsystems of retractable display system 20.

Figure 15:
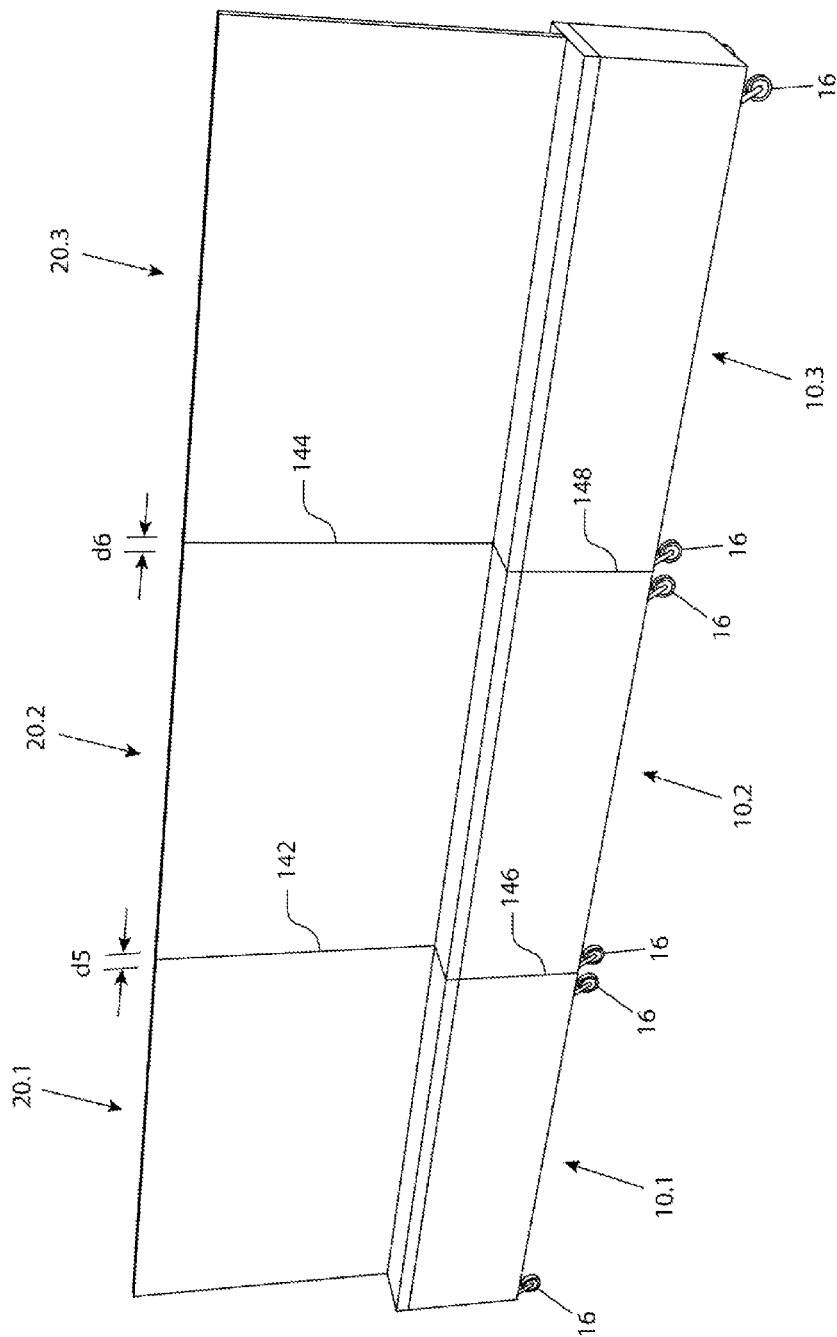
FIG. 15 is a perspective front view of two or more exemplary retractable display system positioned side-by-side to create a wall display thereof.

Referring now to FIG. 15 by way of example, and not limitation, there is illustrated an alternate example embodiment of two or more retractable or flexible display systems 20 positioned side-by-side. Display system 20 preferably includes one or more display system 20, such as display system 20.1, display system 20.2, and display system 20.3. Preferably, display system 20.1 is rolled or positioned in a first position, next display system 20.2 is preferably rolled or positioned side-by-side display system 20.1 with seam 142 or display gap d5 between display systems 20.1 and display system 20.2. Next, display system 20.3 is preferably rolled or positioned side-by-side display system 20.2 with seam 144 or display gap d6 between display systems 20.2 and display system 20.3.

One problem to overcome is that if retractable or flexible display systems 20 are positioned side-by-side and if display gap d5 or d6 is of such size that vertical gap lines are visible in the resulting display which is distracting to a viewer and renders an image of poorer quality. It is contemplated herein that if display gap d5 or d6 is to close or narrow then a bright line may appear at seam 142 and/or seam 144 and if display gap d5 or d6 is too far apart or wide dark line may appear between a at seam 142 and/or seam 144, thus such gaps would be noticeable to and distracting to a viewer.

Figure 16:
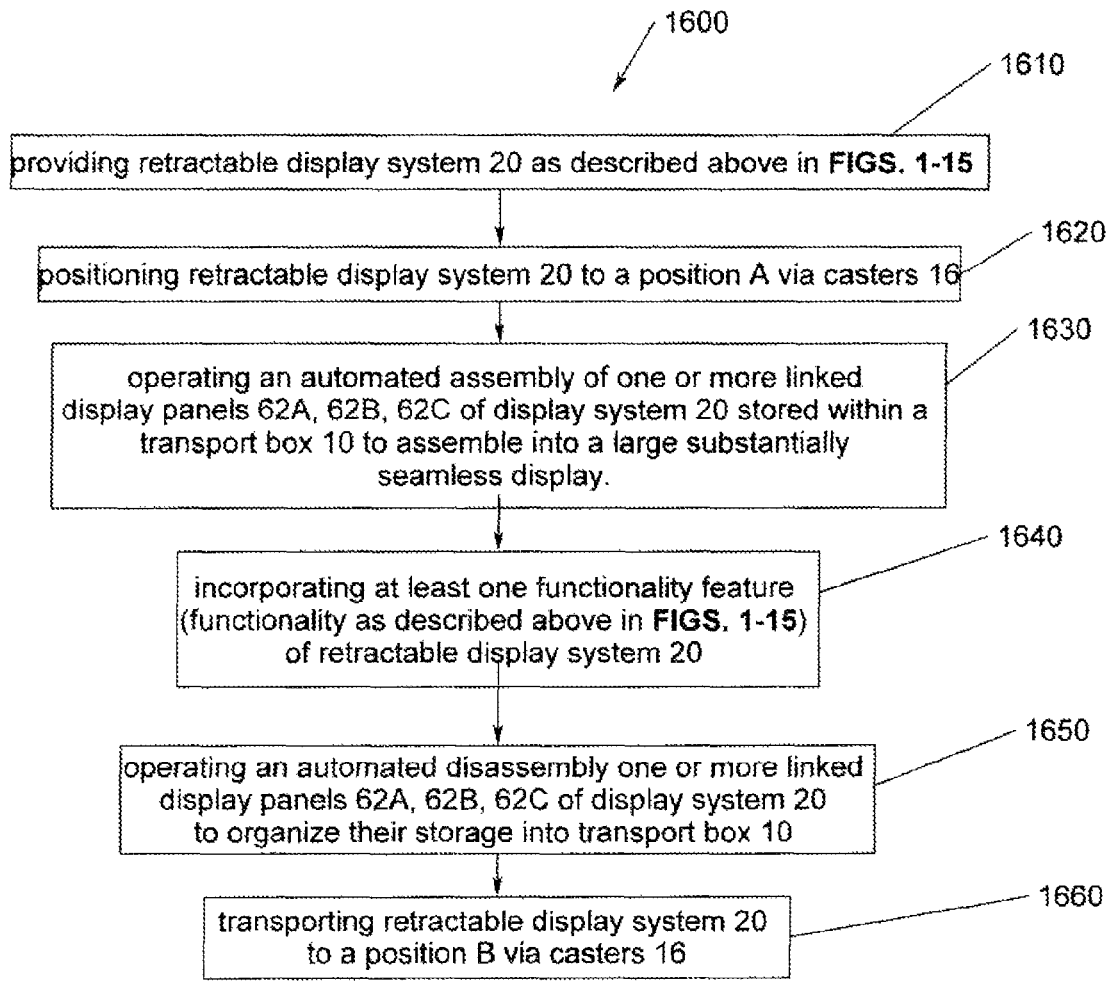
FIG. 16 is a flow diagram a method of using retractable display system.

Referring now to FIG. 16, there is illustrated a flow diagram 1600 a method of using (deploying and storing) retractable display system 20. In block or step 1610, providing retractable display system 20 configured as described above in FIGS. 1-15. In block or step 1620, transporting or positioning retractable display system 20 to a position A via rolling on casters 16. In block or step 1630, operating an automated assembly of display system 20 to deploying one or more linked display panels 62A, 62B, 62C stored within a transport box 10, by elevating moveable support structure 32 from an approximately horizontal position (as shown) or storage position to an approximately upright, elevated, or vertical position; lifting display panel 62A from a storage position within portable transport box 10 to a vertical display position, lifting display panel 62B and display panel 62C interlinked to display panel 62A from a storage position within portable transport box 10 to a vertical display position above stop assembly 92, lowering linked display panels 62A, 62B, 62C until display panel 62C seats on stop assembly 92, lowering linked display panels 62A, 62B, 62C until alignment device 99 aligns display panels 62A, 62B, 62C into a large substantially seamless display. Preferably, operating retractable display system 20 includes operation of media player 40, DC power supply system 50, AC to DC power supply system 60, one of one or more display sub-assemblies 54 to generate an image on the display. In block or step 1640, incorporating at least one functionality feature (functionality as described above in FIGS. 1-15) of retractable display system 20. In block or step 1650, operating an automated disassembly of display system 20 to store one or more linked display panels 62A, 62B, 62C within a transport box 10; by lifting one or more linked display panels 62A, 62B, 62C to a vertical position above stop assembly 92 and separating one or more linked display panels 62A, 62B, 62C, retracting stop assembly 92, lowering one or more linked display panels 62A, 62B, 62C until display panels 62A, 62B, 62C transition from a vertical display position to a storage position within portable transport box 10, retracting said moveable support structure into said portable transport box 10. In block or step 1660, transporting retractable display system 20 to a position B via rolling on casters 16.

The foregoing description and drawings comprise illustrative embodiments of the present invention. Having thus described exemplary embodiments, it should be noted by those ordinarily skilled in the art that the disclosures within are exemplary only, and that various other alternatives, adaptations, and modifications may be made within the scope of the present invention. Merely listing or numbering the steps of a method in a certain order does not constitute any limitation on the order of the steps of that method. Many modifications and other embodiments of the invention will come to mind to one ordinarily skilled in the art to which this invention pertains, having the benefit of the teachings presented in the foregoing descriptions and the associated drawings. Although specific terms may be employed herein, they are used in a generic and descriptive sense only and not for purposes of limitation. Moreover, the present invention has been described in detail; it should be understood that various changes, substitutions and alterations can be made thereto without departing from the spirit and scope of the invention as defined by the appended claims. Accordingly, the present invention is not limited to the specific embodiments illustrated herein, but is limited only by the following claims.

What is claimed is:
1. A retractable display system comprising:
two or more interlinked display panels, said display panels having one or more display sub-assemblies, each display sub-assembly comprising a plurality of light emitters arranged in a matrix pattern having a uniform pixel gap between adjacent light emitters, each display panel further characterized in that a uniform sub-assembly gap is provided between adjacent display sub-assemblies, said sub-assembly gap being substantially equal to said pixel gap;

a transport box configured to enclose the display system, said transport box configured with a moveable support structure configured to support said two or more interlinked display panel;

a lift system configured to lift said interlinked display panels; and, an alignment system comprising an alignment protrusion and an aperture configured to align said two or more interlinked display panels to form a substantially seamless display system, wherein said two or more interlinked display panels is greater in height than said transport box, said alignment protrusion and aperture providing a uniform assembly gap between adjacent display panels such that said assembly gap and said pixel gap are substantially equal.

2. The retractable display system of claim 1, wherein said two or more interlinked display panels are configured as a single sided display.

3. The retractable display system of claim 1, wherein said two or more interlinked display panels are configured as a two sided display having a front display and a back display.

4. The retractable display system of claim 1, wherein said transport box further comprises a first guide support surface and a second guide support surface for each of said two or more interlinked display panels.

5. The retractable display system of claim 4, wherein said two or more interlinked display panels further comprises a first interlinked display panel linked to a second interlinked display panel.

6. The retractable display system of claim 5, wherein said first guide support surface and said second guide support surface of said first interlinked display panel is offset from another said first guide support surface and said second guide support surface of said second interlinked display panel.

7. The retractable display system of claim 6, wherein said two or more interlinked display panels further comprises a display panel bracket assembly.

8. The retractable display system of claim 7, wherein said display panel bracket assembly further comprises a first bracket end and a second bracket end affixed on opposite ends of each display panel of said two or more interlinked display panels.

9. The retractable display system of claim 8, wherein said first bracket end further comprises a first protruding device affixed thereto and said second bracket end further comprise comprises a second protruding device affixed thereto.

10. The retractable display system of claim 9, wherein said first protruding device is configured to contact said first guide support surface and said second protruding device is configured to contact said second guide support surface.

11. The retractable display system of claim 10, wherein said moveable support structure further comprises a first moveable support structure configured with a first lift system and a second moveable support structure configured with a second lift system.

12. The retractable display system of claim 11, wherein said first lift system is configured having a first lift hook and said second lift system is configured having a second lift hook.

13. The retractable display system of claim 12, wherein said first lift hook engages said first protruding device and said second lift system engages said second protruding device to lift said first interlinked display panel.

14. The retractable display system of claim 13, wherein said first interlinked display panel is lifted from an angled lateral storage position to a vertical display position.

15. The retractable display system of claim 14, wherein said first interlinked display panel lifts said second interlinked display panel.

16. The retractable display system of claim 15, wherein said first interlinked display panel lifts said second interlinked display panel above a stop assembly positioned on said moveable support structure.

17. The retractable display system of claim 16, wherein said alignment system is disposed between said first interlinked display panel and said second interlinked display panel.

18. The retractable display system of claim 17, wherein said first lift system and said second lift system lower said first interlinked display panel and said second interlinked display panel until said second interlinked display panel seats on said stop assembly.

19. The retractable display system of claim 18, wherein said first lift system and said second lift system lower said first interlinked display panel until said alignment pin inserts therein said aperture between said first interlinked display panel and said second interlinked display panel.

20. A method of deploying a foldable display system, said method comprising the steps of:

providing two or more interlinked display panels, said two or more interlinked display panels including a first interlinked display panel linked to a second interlinked display panel, said display panels having one or more display sub-assemblies, each display sub-assembly comprising a plurality of light emitters arranged in a matrix pattern having a uniform pixel gap between adjacent light emitters, each display panel further characterized in that a uniform sub-assembly gap is provided between adjacent display sub-assemblies, said sub-assembly gap being substantially equal to said pixel gap; a portable transport box configured to enclose the display system, said portable transport box configured with a moveable support structure configured to support said two or more interlinked display panel, a lift system configured to lift said interlinked display panels, a stop assembly positioned on said moveable support structure, and an alignment system, said alignment system comprising:

an alignment protrusion and an aperture disposed between said first interlinked display panel and said second interlinked display panel, and configured to align said two or more interlinked display panels to form a substantially seamless display system, wherein said two or more interlinked display panels is greater in height than said transport box;

positioning said portable transport box;

elevating said moveable support structure from within said portable transport box; lifting said first interlinked display panel from a storage position within said portable transport box to a vertical display position;

lifting said second interlinked display panel, interlinked to said first interlinked display panel, from a storage position within said portable transport box to a vertical display position above said stop assembly;

lowering said first interlinked display panel and said second interlinked display panel until said second interlinked display panel seats on said stop assembly; and lowering said first interlinked display panel and said second interlinked display panel until said alignment system aligns said first interlinked display panel and said second interlinked display panel to form a substantially seamless display system, said alignment protrusion and aperture providing a uniform assembly gap between adjacent display panels and further characterized in that said assembly gap and said pixel gap are substantially equal.

21. A method of storing a foldable display system, said method comprising the steps of:

providing two or more interlinked display panels, said two or more interlinked display panels including a first interlinked display panel linked to a second interlinked display panel, said display panels having one or more display sub-assemblies, each display sub-assembly comprising a plurality of light emitters arranged in a matrix pattern having a uniform pixel gap between adjacent light emitters, each display panel further characterized in that a uniform sub-assembly gap is provided between adjacent display sub-assemblies, said sub-assembly gap being substantially equal to said pixel gap; a portable transport box configured to enclose the display system, said portable transport box configured with a moveable support structure configured to support said two or more interlinked display panel, a lift system configured to lift said interlinked display panels, a stop assembly positioned on said moveable support structure, and an alignment system, said alignment system comprising:

an alignment protrusion and aperture disposed between said first interlinked display panel and said second interlinked display panel, and configured to align said two or more interlinked display panels to form a substantially seamless display system, wherein said two or more interlinked display panels is greater in height than said transport box, said alignment protrusion and aperture providing a uniform assembly gap between adjacent display panels and further characterized in that said assembly gap and said pixel gap are substantially equal;

lifting said first interlinked display panel and said second interlinked display panel above said stop assembly and separating said first interlinked display panel from said second interlinked display panel;

retracting said stop assembly;

lowering said first interlinked display panel and said second interlinked display panel until said second interlinked display panel transitions from a vertical display position to a storage position within said portable transport box;

lowering said first interlinked display panel until said first interlinked display panel transitions from a vertical display position to a storage position within said portable transport box; and retracting said moveable support structure into said portable transport box.

* * * * *